United States Patent
Nagumo

(10) Patent No.: US 8,542,262 B2
(45) Date of Patent: Sep. 24, 2013

(54) LIGHT EMITTING ELEMENT ARRAY, DRIVE CIRCUIT, OPTICAL PRINT HEAD, AND IMAGE FORMING APPARATUS

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 778 days.

(21) Appl. No.: 12/615,523

(22) Filed: Nov. 10, 2009

(65) Prior Publication Data

US 2010/0124438 A1    May 20, 2010

(30) Foreign Application Priority Data

Nov. 14, 2008  (JP) ................................ 2008-292020

(51) Int. Cl.
| | |
|---|---|
| B41J 2/415 | (2006.01) |
| B41J 2/435 | (2006.01) |
| B41J 2/47 | (2006.01) |
| B41J 2/45 | (2006.01) |

(52) U.S. Cl.
USPC ............ 347/238; 347/128; 347/237; 347/247

(58) Field of Classification Search
USPC .................................. 347/128, 237, 238, 247
See application file for complete search history.

(56) References Cited

U.S. PATENT DOCUMENTS

| | | | | |
|---|---|---|---|---|
| 6,717,183 B2 * | 4/2004 | Ohno et al. | ...................... | 257/88 |
| 7,286,259 B2 * | 10/2007 | Ohno et al. | ...................... | 358/1.8 |
| 7,924,304 B2 * | 4/2011 | Nagumo | ...................... | 347/238 |
| 7,989,825 B2 * | 8/2011 | Hamanaka et al. | ............. | 257/95 |
| 7,990,407 B2 * | 8/2011 | Nagumo | ...................... | 347/237 |
| 8,022,387 B2 * | 9/2011 | Ogihara et al. | ................. | 257/13 |
| 8,258,723 B2 * | 9/2012 | Nagumo | ...................... | 315/313 |
| 2010/0124438 A1 * | 5/2010 | Nagumo | ...................... | 399/220 |
| 2011/0050838 A1 * | 3/2011 | Nagumo | ...................... | 347/224 |
| 2011/0063400 A1 * | 3/2011 | Kondoh | ...................... | 347/224 |
| 2011/0133789 A1 * | 6/2011 | Nagumo | ...................... | 327/108 |
| 2011/0181640 A1 * | 7/2011 | Nagumo | ...................... | 347/9 |
| 2011/0234001 A1 * | 9/2011 | Nagumo | ...................... | 307/31 |
| 2011/0234734 A1 * | 9/2011 | Nagumo | ...................... | 347/132 |
| 2011/0234741 A1 * | 9/2011 | Nagumo | ...................... | 347/224 |
| 2011/0234742 A1 * | 9/2011 | Nagumo | ...................... | 347/224 |
| 2011/0234743 A1 * | 9/2011 | Nagumo | ...................... | 347/224 |
| 2011/0262184 A1 * | 10/2011 | Nagumo | ...................... | 399/177 |
| 2011/0285805 A1 * | 11/2011 | Nagumo | ...................... | 347/247 |
| 2012/0001996 A1 * | 1/2012 | Nagumo | ...................... | 347/224 |
| 2012/0050450 A1 * | 3/2012 | Nagumo | ...................... | 347/237 |
| 2012/0249716 A1 * | 10/2012 | Nagumo | ...................... | 347/224 |
| 2012/0251181 A1 * | 10/2012 | Nagumo | ...................... | 399/177 |
| 2012/0301164 A1 * | 11/2012 | Nagumo | ...................... | 399/51 |

FOREIGN PATENT DOCUMENTS

| | | |
|---|---|---|
| JP | 2007-081081 A | 3/2007 |
| JP | 2008-166610 A | 7/2008 |

* cited by examiner

*Primary Examiner* — Uyen Chau N Le
*Assistant Examiner* — John M Bedtelyon
(74) *Attorney, Agent, or Firm* — Kubotera & Associates, LLC

(57) ABSTRACT

A light emitting element array includes a plurality of light emitting elements each having a first terminal, a second terminal, and a third terminal. The light emitting elements are arranged next to each other to form a group. The first terminal receives a drive signal, the second terminal is connected to ground, and the third terminal has a threshold voltage or a threshold current controllable from outside so that the light emitting elements are driven in a time division way.

8 Claims, 17 Drawing Sheets

LIGHT EMITTING ELEMENT ARRAY, DRIVE CIRCUIT, OPTICAL PRINT HEAD, AND IMAGE FORMING APPARATUS

BACKGROUND OF THE INVENTION AND RELATED ART STATEMENT

The present invention relates to a light emitting element array having a plurality of light emitting elements such as light emitting thyristors arranged therein; a drive circuit for driving the light emitting element array in a time division way; an optical print head including the light emitting element array and the drive circuit; and an image forming apparatus such as an electro-photography printer including the optical print head.

In a conventional image forming apparatus (for example, an electro-photography printer using an electro-photography process), a light emitting diode (LED) print head has a plurality of LEDs arranged in a matrix pattern (refer to Patent Reference). A power MOS transistor is connected to a common connection terminal of the LEDs, so that the LEDs to be lit are switched in a time division way.

Patent Reference: Japanese Patent Publication No. 2007-81081

In the conventional LED print head having a plurality of LEDs arranged in a matrix pattern, the number of the LEDs may reach few thousands. When all of the LEDs emit light, a large current flows through the common connection terminal. Accordingly, it is necessary to provide the power MOS transistor with a capability of driving a large current. As a result, a chip size of the power MOS transistor increases, thereby making it difficult to reduce a size of the LED print head or cost thereof.

In view of the problems described above, an object of the present invention is to provide a light emitting element array, a drive circuit, an optical print head, and an image forming apparatus capable of solving the problems of the conventional light emitting element array.

Further objects and advantages of the invention will be apparent from the following description of the invention.

SUMMARY OF THE INVENTION

In order to attain the objects described above, according to a first aspect of the present invention, a light emitting element array includes a plurality of light emitting elements (for example, light emitting thyristors) each having a first terminal, a second terminal, and a third terminal. A threshold voltage or a threshold current of the third terminal is controllable from outside. The light emitting elements arranged next to each other form a group. A drive signal is supplied to the first terminals. The second terminals are commonly connected to ground. A control signal is applied to the third terminals, so that the light emitting elements are driven in a time division way.

According to a second aspect of the present invention, a drive circuit is provided for driving the light emitting element array. The drive circuit includes a plurality of drive elements for supplying the drive signal to the first terminals of the light emitting elements; a plurality of common base lines for instructing on/off of the light emitting elements; and a plurality of individual circuits having a level shift function for applying a control signal to the third terminals of the light emitting elements. The common base lines are connected to the third terminals of the light emitting elements through the individual circuits.

According to a third aspect of the present invention, an optical print head includes the light emitting element array; the drive circuit; and a lens array for collecting light emitted from the light emitting element array.

According to a fourth aspect of the present invention, an image forming apparatus includes the optical print head; and a photosensitive member facing the optical print head in a light emitting direction thereof.

In the present invention, instead of an LED having two terminals, the light emitting element (for example, a light emitting thyristor) has the three terminals. Gate drive circuits are consolidated in one location for driving gates of the light emitting elements with the three terminals, so that it is possible to drive the gates through the individual circuits with the level shift function per the gates of the light emitting elements with the three terminals. Accordingly, it is possible to minimize interference between the light emitting elements driven concurrently, thereby driving the light emitting elements under an ideal condition. As a result, it is possible to eliminate a power MOS transistor, thereby making it possible to reduce sizes of the drive circuit, the optical print head, and the image forming apparatus, and cost thereof.

BRIEF DESCRIPTION OF THE DRAWINGS

FIGS. 12(a) to 12(c) are views showing an operation of the light emitting thyristor in a turn-on process according to the first embodiment of the present invention, wherein FIGS. 12(a) and 12(b) are circuit diagrams showing the operation of the light emitting thyristor in the turn-on process, and FIG. 12(c) is a graph showing a waveform of the light emitting thyristor in the turn-on process;

FIGS. 15(a) to 15(d) are views showing an individual circuit of a driver IC for driving a gate according to a second embodiment of the present invention, wherein FIG. 15(a) is a model diagram of the individual circuit, FIG. 15(b) is a circuit diagram of the individual circuit, FIG. 15(c) is a schematic sectional view of an IC chip of the individual circuit, and FIG. 15(d) is an equivalent circuit diagram of the individual circuit;

DETAILED DESCRIPTION OF PREFERRED EMBODIMENTS

Hereunder, preferred embodiments of the present invention will be explained with reference to the accompanying drawings. Note that the drawings are only for an explanation purpose, and the present invention is not limited to the drawings.

First Embodiment

Figure 2:
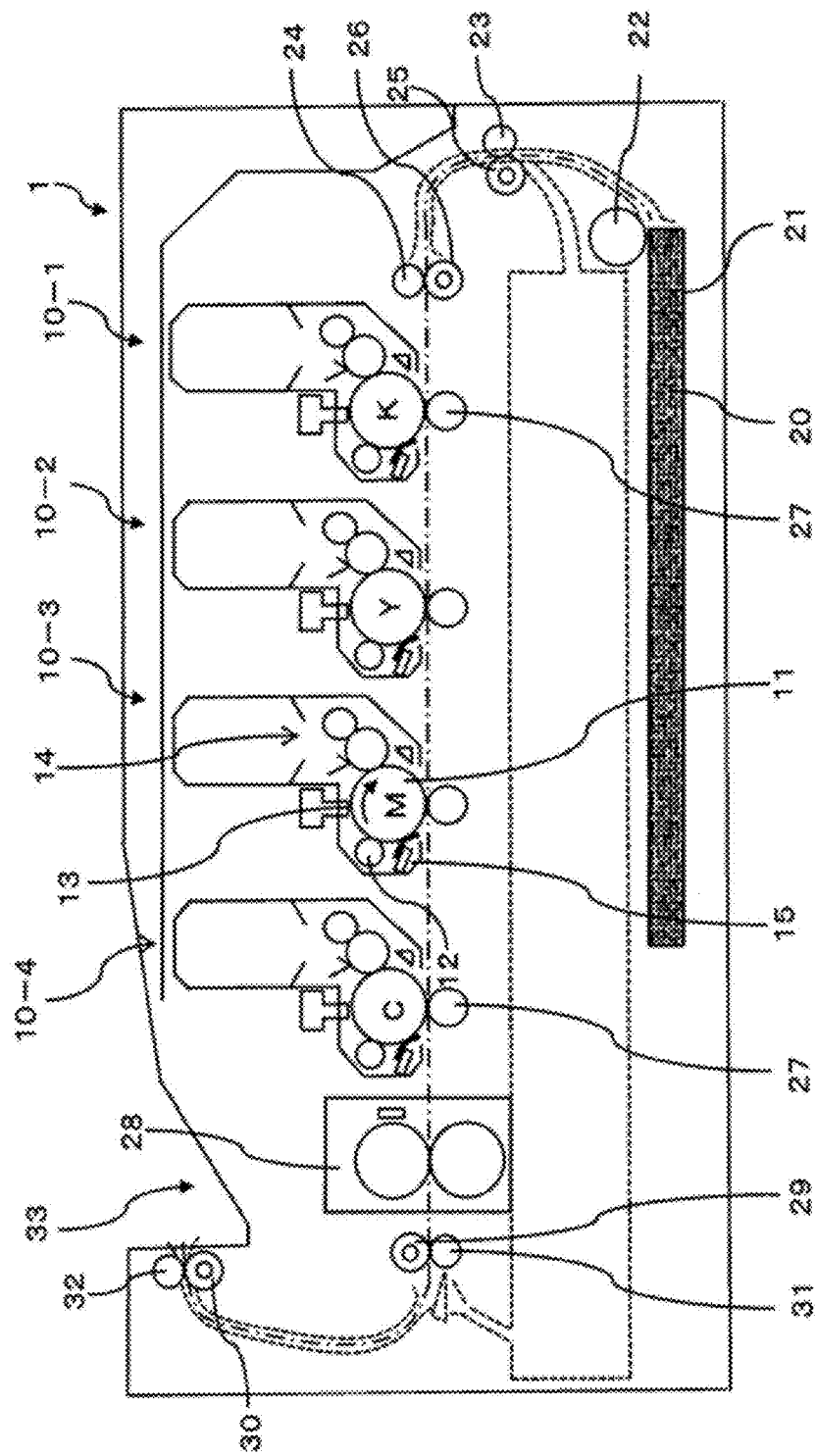
FIG. 2 is a schematic sectional view showing a configuration of an image forming apparatus according to the first embodiment of the present invention.

A first embodiment of the present invention will be explained. FIG. 2 is a schematic sectional view showing a configuration of an image forming apparatus 1 according to the first embodiment of the present invention.

In the embodiment, the image forming apparatus 1 is an electro-photography color printer of a tandem type provided with an optical print head having a light emitting element array using light emitting thyristors as three terminal switch elements or light emitting elements (driven elements), instead of LEDs (Light Emitting Diodes) with two terminals.

As shown in FIG. 2, the image forming apparatus 1 includes four process units 10-1 to 10-4 for sequentially forming images in colors of black (K), yellow (Y), magenta (M), and cyan (C). The process units 10-1 to 10-4 are arranged in this order along a transportation path of a recoding medium 20 (for example, a sheet) from an upstream side thereof. The process units 10-1 to 10-4 have an identical inner configuration, and an inner configuration of the process unit 10-3 of magenta will be explained as an example.

In the embodiment, the process unit 10-3 includes a photosensitive member 11 (for example, a photosensitive drum) as an image supporting member arranged to be rotatable in an arrow direction in FIG. 2. There are disposed around the photosensitive member 11 from an upstream side in a rotational direction thereof a charging device 12 for supplying charges to a surface of the photosensitive member 11 to charge, and an exposure device 13 (for example, the optical print head) for selectively irradiating light on the surface of the photosensitive member 11 to form a static latent image.

Further, the process unit 10-3 includes a developing device 14 for attaching toner of magenta (a specific color) to the surface of the photosensitive member 11 with the static latent image formed thereon to develop the static latent image, and a cleaning device 15 for removing toner remaining on the photosensitive member 11 upon transferring a toner image. A drive source (not shown) drives a drum and a roller of the devices described above through a gear and the likes.

In the embodiment, the image forming apparatus 1 further includes a sheet cassette 21 at a lower portion thereof for retaining the sheet 20 in a stacked state, and a hopping roller 22 above the sheet cassette 21 for separating and transporting the sheet 20 one by one. A transportation roller 25 is disposed on a downstream side in a direction that the sheet 20 is transported for sandwiching and transporting the sheet 20 together with pinch rollers 23 and 24. A register roller 26 is disposed also on the downstream side in the direction that the sheet 20 is transported for correcting skew of the sheet 20 and transporting the sheet 20 to the process unit 10-3. A drive source (not shown) drives the hopping roller 22, the transportation roller 25, and the register roller 26 to rotate through a gear and the likes.

In each of process units 10-1 to 10-4, a transfer roller 27 formed of a semi-conductive rubber and the likes is arranged to face the photosensitive member 11. When the transfer roller 27 transfers the toner image formed on the photosensitive member 11 to the sheet 20, a voltage is applied to the transfer roller 27 for generating a potential difference between a surface potential of the photosensitive member 11 and a surface potential of the transfer roller 27.

In the embodiment, a fixing device 28 is disposed on a downstream side of the process unit 10-4. The fixing device 28 includes a heating roller and a backup roller, so that the fixing device 28 fixes the toner image transferred to the sheet 20 through heat and pressure.

In the embodiment, discharge rollers 29 and 30, pinch rollers 31 and 32, and a sheet stacker portion 33 are arranged on a downstream side of the fixing device 28. The discharge rollers 29 and 30 sandwich the sheet 20 discharged from the fixing device 28 together with the pinch rollers 31 and 32, so that the sheet 20 is transported to the sheet stacker portion 33. A drive source (not shown) drives the fixing device 28, the discharge rollers 29 and 30, and the likes to rotate through a gear and the likes.

An operation of the image forming apparatus 1 will be explained next. First, the hopping roller 22 separates and transports the sheet 20 retained in the sheet cassette 21 one by one. Then, the transportation roller 25, the register roller 26 and the pinch rollers 23 and 24 sandwich and transport the sheet 20 to a space between the photosensitive member 11 and the transfer roller 27 of the process unit 10-1.

In the next step, the photosensitive member 11 and the transfer roller 27 sandwich the sheet 20, so that the toner image is transferred to a recording surface of the sheet 20. Then, the photosensitive member 11 rotates to transport the sheet 20 to the process unit 10-2. Through the steps described above, the sheet 20 sequentially passes through the process units 10-2 to 10-4. Accordingly, the toner images in colors developed from the static latent images formed with the optical print heads 13 are sequentially transferred and overlapped on the recording surface of the sheet 20.

After the toner images in colors are overlapped on the recording surface of the sheet 20, the fixing device 28 fixes the toner images to the sheet 20. Then, the discharge rollers 29 and 30 and the pinch rollers 31 and 32 sandwich the sheet 20 to discharge the sheet 20 outside the image forming apparatus 1, thereby forming a color image on the sheet 20.

Figure 3:
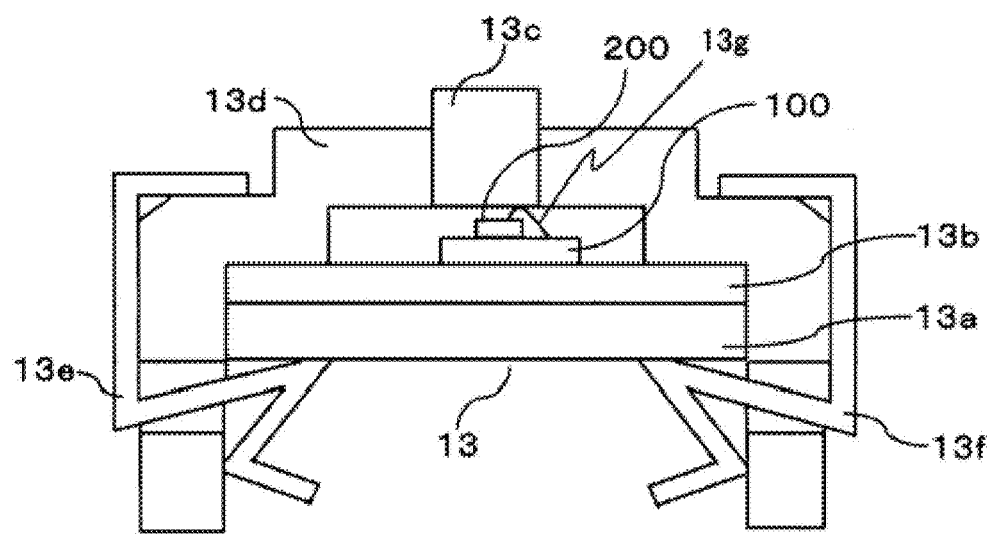
FIG. 3 is a schematic sectional view showing a configuration of the optical print head according to the first embodiment of the present invention.
Figure 4:
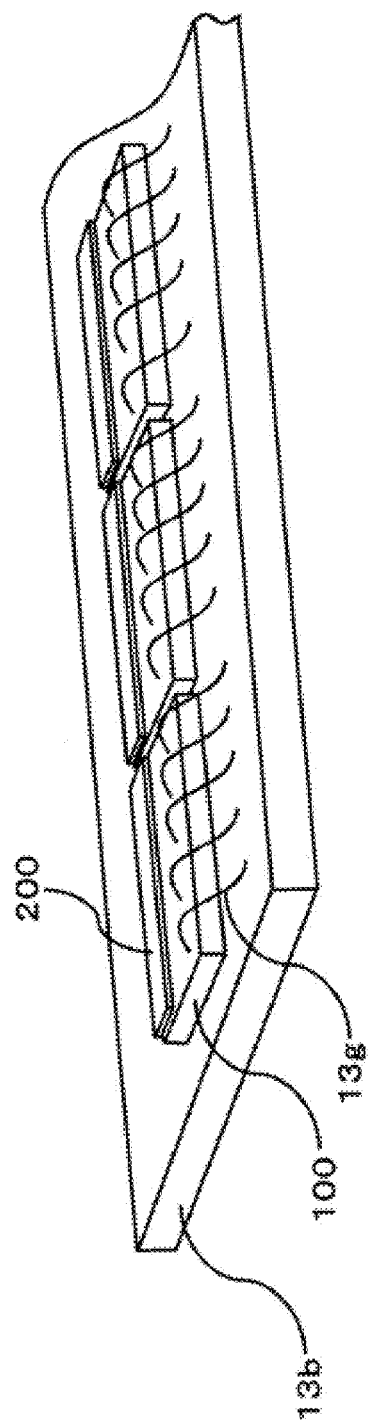
FIG. 4 is a schematic perspective view showing a circuit board unit of the optical print head according to the first embodiment of the present invention.

A configuration of the optical print head 13 will be explained next. FIG. 3 is a schematic sectional view showing the configuration of the optical print head 13 according to the first embodiment of the present invention. FIG. 4 is a schematic perspective view showing a circuit board unit of the optical print head 13 according to the first embodiment of the present invention.

As shown in FIGS. 3 and 4, the optical print head 13 includes a base member 13a, so that the circuit board unit shown in FIG. 4 is disposed on the base member 13a. The circuit board unit includes a print circuit board 13b fixed to the base member 13a; driver integrated circuits 100 (referred to as driver ICs) having a chip shape attached to the print circuit board 13b with an adhesive and having integrated circuits (referred to as drivers) integrated therein; and light emitting element arrays 200 formed of a plurality of light emitting element rows (for example, light emitting thyristor rows) having a chip shape attached to the driver integrated circuits 100 (driver ICs).

In the embodiment, each of the light emitting element arrays 200 is electrically connected to each of the driver ICs 100 through a thin layer wiring portion (not shown). Further, each of the driver ICs 100 has a plurality of terminals electrically connected to wiring pads (not shown) on the print circuit board 13b through bonding wires 13g.

As shown in FIG. 3, a lens array 13c (for example, a rod lens array) is disposed on each of the light emitting element arrays 200. The lens array 13c has a plurality of optical elements having a column shape, and is held with a holder 13d. The base member 13a, the print circuit board 13b, and the holder 13d are fixed with clamp members 13e and 13f.

Figure 5:
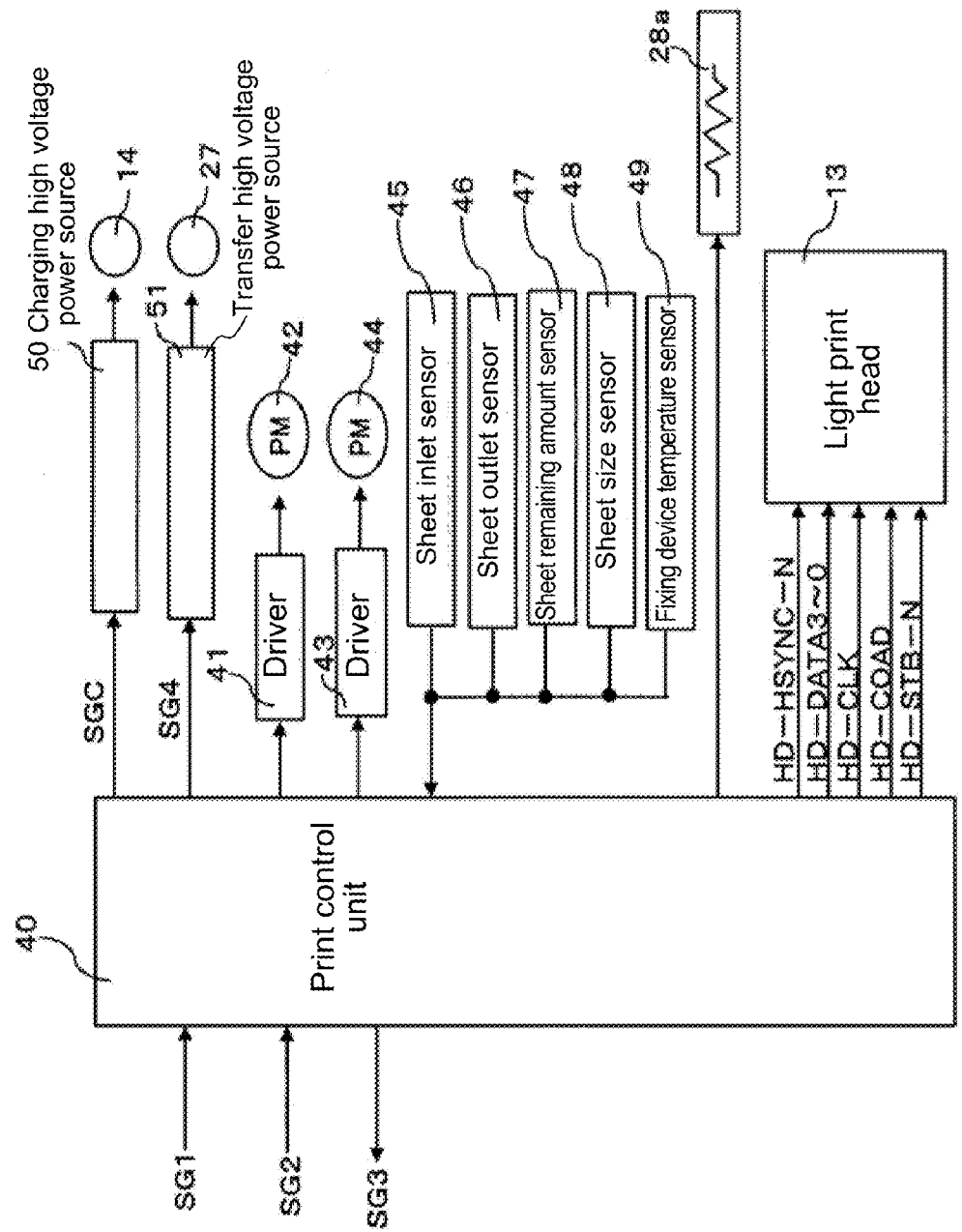
FIG. 5 is a block diagram showing a configuration of a printer control circuit of the image forming apparatus according to the first embodiment of the present invention.

A printer control circuit will be explained next. FIG. 5 is a block diagram showing a configuration of the printer control circuit of the image forming apparatus 1 according to the first embodiment of the present invention.

As shown in FIG. 5, the printer control circuit includes a print control unit 40 disposed in a printing portion of the image forming apparatus 1. The print control unit 40 includes a microprocessor, an ROM (Read Only Memory), an RAM (Random Access Memory), an input-output port, a timer, and the likes. The print control unit 40 sequentially controls an entire operation of the image forming apparatus 1 to perform a printing operation according to a control signal SG1, a video signal SG2 (dot map data arranged in a one-dimensional pattern), and the likes sent from a host device (not shown).

In the embodiment, the print control unit 40 is connected to the optical print heads 13 of the process units 10-1 to 10-4; the heating roller 28a of the fixing device 28; drivers 41 and 43; a sheet inlet sensor 45; a sheet outlet sensor 46; a sheet remaining amount sensor 47; a sheet size sensor 48; a fixing device temperature sensor 49; a charging high voltage power source 50; a transfer high voltage power source 51; and the likes. The driver 41 is connected to a developer transfer process motor (PM) 42; the driver 43 is connected to a sheet transportation motor (PM) 44; the charging high voltage power source 50 is connected to the developing device 14; and the transfer high voltage power source 51 is connected to the transfer rollers 27.

An operation of the printer control circuit will be explained next. When the print control unit 40 receives a print instruction through the control signal SG1 from the host device, the print control unit 40 controls the fixing device temperature sensor 49 to determine whether the heating roller 28a in the fixing device 28 is within an operable temperature range. When the heating roller 28a is not within the operable temperature range, the heating roller 28a is turned on to heat the fixing device 28 to an operable temperature. In the next step, the print control unit 40 controls the driver 41 to rotate the developer transfer process motor 42. At the same time, according to a charge signal SGC, the print control unit 40 turns on the charging high voltage power source 50 to charge the developing device 14.

In the next step, the sheet remaining amount sensor 47 detects the sheet 20 set as shown in FIG. 2, and the sheet size sensor 48 detects a type of the sheet 20. The sheet transportation motor 44 is rotatable in both directions through the driver 43. First, the sheet transportation motor 44 rotates in a reverse direction to transport the sheet 20 for a specific distance until the sheet inlet sensor 45 detects the sheet 20. Then, sheet transportation motor 44 rotates in a forward direction to transport the sheet 20 to a print mechanism inside the image forming apparatus 1.

In the embodiment, when the sheet reaches a printable position, the print control unit 40 sends a timing signal SG3 (including a main scanning synchronization signal and a sub scanning synchronization signal) to the host device, and receives the video signal SG2 from the host device. After the host device edits the video signal SG2 per page and sends the video signal SG2 to the print control unit 40, the video signal SG2 is transmitted to the optical print heads 13 as print data signals HD-DATA3 to HD-DATA0. In the optical print heads 13, a plurality of light emitting thyristors is arranged in a substantially linear pattern each for printing one dot (pixel).

When the print control unit 40 receives the video signal SG2 for one line, the print control unit 40 sends a latch signal HD-LOAD to the optical print heads 13, so that the optical print heads 13 hold the latch signal HD-LOAD therein. While receiving the video signal SG2 from the host device in the next step, the print control unit 40 is capable of printing according to the print data signals HD-DATA3 to HD-DATA0 retained in the optical print heads 13.

In the embodiment, the print control unit 40 further sends a clock signal HD-CLK, a main scanning synchronization signal HD-HSYNC-N, and a strobe signal HD-STB-N to the optical print heads 13. The clock signal HD-CLK is a signal for sending the print data signals HD-DATA3 to HD-DATA0 to the optical print heads 13.

In the embodiment, the video signal SG2 is transmitted and received per print line. The optical print heads 13 print information to become the static latent images on the photosensitive drums 11 as dots with an elevated potential. In the developing devices 14, toner for forming an image charged with a negative potential is attracted to the dots through an electrical attractive force, thereby forming the toner images.

In the next step, the toner images are transported to the transfer rollers 27. The transfer high voltage power source 51 is turned on to a positive potential with a transfer signal SG4. Accordingly, the transfer rollers 27 transfer the toner images to the sheet 20 passing through between the photosensitive drums 1 and the transfer rollers 27. After the toner images are transferred, the sheet 20 is transported to the fixing device 28 with the heating roller 28a, so that the fixing device 28 fixes the toner images to the sheet 20 through heat. After the toner images are fixed, the sheet 20 is transported from the print mechanism of the image forming apparatus 1 and passes through the sheet outlet sensor 46, thereby discharging outside the image forming apparatus 1.

According to detection of the sheet size sensor 48 and the sheet inlet sensor 45, the print control unit 40 controls the transfer high voltage power source 51 to apply a voltage to the transfer rollers 27 only when the sheet 20 passes through the transfer rollers 27. After the printing operation is completed, when the sheet 20 passes through the sheet outlet sensor 46, the charging high voltage power source 50 stops applying a voltage to the developing devices 14, and the developer transfer process motor (PM) 42 stops. Afterward, the process described above is repeated.

Figure 1:
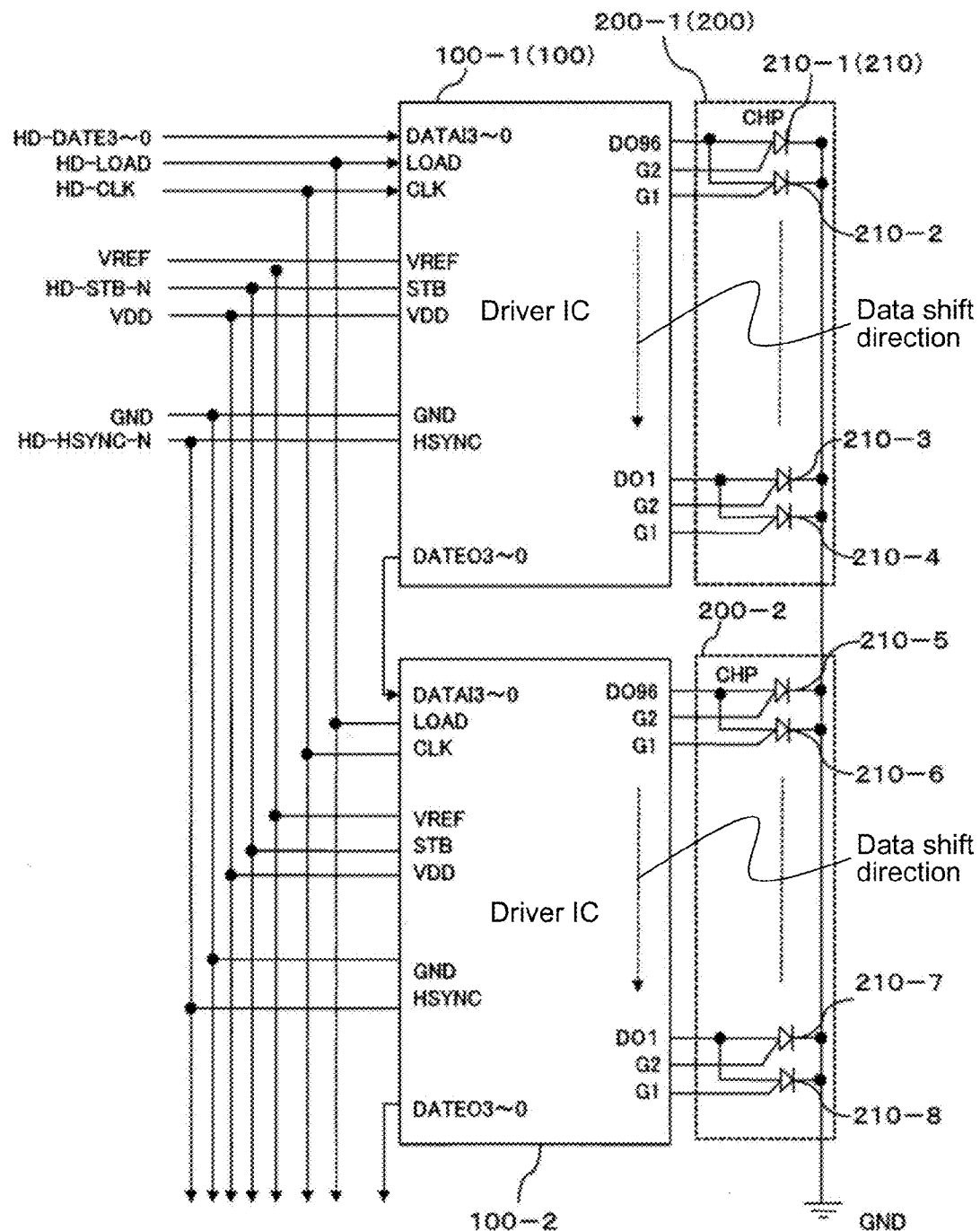
FIG. 1 is a block diagram showing an electrical configuration of an optical print head according to a first embodiment of the present invention.

An electrical configuration of the optical print heads 13 of the process units 10-1 to 10-4 will be explained next. FIG. 1 is a block diagram showing the electrical configuration of the optical print head 13 according to a first embodiment of the present invention.

In the embodiment, the optical print head 13 is capable of printing on an A4 size sheet at a resolution of 600 dots per one inch. The optical print head 13 includes 4,992 of the light emitting elements (for example, the light emitting thyristors as three-terminal switch elements). Accordingly, 26 of the light emitting element arrays 200 (200-1 to 200-26) are arranged in the optical print head 13.

In the embodiment, each of the light emitting element arrays 200 includes 192 of light emitting thyristors 210. In each of the light emitting element arrays 200, each of the light emitting thyristors 210 has a second terminal (for example, a cathode) connected to ground and a first terminal (for example, an anode) connected to the first terminal of another light emitting thyristor 210 arranged adjacently. Accordingly, the light emitting thyristors 210 on odd number orders and the light emitting thyristors 210 on even number orders are driven in a time division way.

In the embodiment, each of the light emitting element arrays 200 includes 26 of the driver ICs 100 (100-1 to 100-26). Each of the driver ICs 100 has an identical circuit diagram, and the driver ICs 100-1 and 100-2 arranged next to each other are connected in a cascade arrangement (tandem connection).

In the embodiment, each of the driver ICs 100 includes DATAI3 to DATAI0 terminals for inputting data; a LOAD terminal; a CLK terminal; a VREF terminal; a STB terminal; a VDD terminal; a GND terminal; an HSYNC terminal; DATAO3 to DATAO0 terminals for outputting data; DO96 to DO1 terminals for driving anodes; and G2 and G1 terminals corresponding to DO96 to DO1 terminals for driving gates.

More specifically, with respect to the DO96 terminal, the G2 terminal and the G1 terminal for driving the anodes correspond to the DO96 terminal. The DO96 terminal is connected to commonly to the anode of the light emitting thyristor 210-1 arranged on an odd number order and the anode of the light emitting thyristor 210-2 arranged on an even number order.

Further, the G2 terminal is connected to a third terminal (for example, a gate) of the light emitting thyristor 210-1 arranged on the odd number order. The G1 terminal is connected to the gate of the light emitting thyristor 210-2 arranged on the even number order. The cathodes of the light emitting thyristor 210-1 and the light emitting thyristor 210-2 are commonly connected to ground (GND). Similarly, the DO95 to DO1 terminals and the corresponding G2 and G1 terminals are connected to the other of the light emitting thyristors 210.

An operation of the optical print head 13 will be explained next. As shown in FIG. 1, the optical print head 13 includes four print data signals HD-DATA3 to HD-DATA0. Accordingly, it is arranged to send data of four pixels corresponding to the light emitting thyristors 210 on odd number orders or even number orders among eight of the light emitting thyristors 210 arranged next to each other per the clock signal HD-CLK.

In the embodiment, the print control unit 40 shown in FIG. 5 outputs the print data signals HD-DATA3 to HD-DATA0 to the driver IC 100-1 together with the clock signal HD-CLK. Accordingly, bit data DATAI0 to DATAI3 for 4,992 dots are sequentially transmitted in a shift register (described later) formed of a flip-flop circuit (FF) in each of the driver ICs 100.

In the next step, the latch signal HD-LOAD is input to all of the driver ICs 100, and the bit data DATAI0 to DATAI3 for 4,992 dots are latched with a latch circuit disposed corresponding to each of FF in each of the driver ICs 100. Then, with the bit data DATAI0 to DATAI3 and the strobe signal HD-STB-N, each of the light emitting thyristors 210 emits light corresponding to dot data DO1, DO2, and the likes as a high level (an H level).

In the embodiment, all of the driver ICs 100 receives a power voltage VDD; a ground voltage GND; a synchronization signal HD-HSYSNC-N for setting an initial state whether the light emitting thyristors 210 on odd number orders or even number orders are driven in the time division way; and a reference voltage VREF for instructing a drive current value for driving the light emitting thyristors 210. A reference voltage generation circuit (not shown) is disposed in the optical print head 13 for generating the reference voltage VREF.

A configuration of the light emitting thyristor 210 will be explained next. FIGS. 6(*a*) to 6(*d*) are schematic views showing the light emitting thyristor 210 of the optical print head 13 according to the first embodiment of the present invention. More specifically, FIG. 6(*a*) is a model diagram of the light emitting thyristor 210, FIG. 6(*b*) is a circuit diagram of the light emitting thyristor 210, FIG. 6(*c*) is a schematic sectional view of a modified example of the light emitting thyristor 210, and FIG. 6(*d*) is an equivalent circuit diagram of the light emitting thyristor 210.

As shown in FIG. 6(*a*), the light emitting thyristor 210 includes three terminals such as an anode K, a cathode K, and a gate G.

As shown in FIG. 6(*b*), the light emitting thyristor 210 has a three-layer structure formed of an N-type layer 211, a P-type layer 212, and an N-type layer 213. The cathode K is formed in the N-type layer 211. The gate G is formed in the N-type layer 213. The anode A is formed in a P-type impurity region 214 in the N-type layer 213.

In the embodiment, the light emitting thyristor 210 with the three-layer structure uses, for example, a GaAs wafer substrate. A specific crystal is grown on an upper layer of the GaAs wafer substrate with an MOCVD (Metal Organic-Chemical Vapor Deposition) method through the following process, thereby forming the light emitting thyristor 210.

First, a sacrifice layer and a buffer layer (not shown) are grown on the GaAs wafer substrate through an epitaxial growth. Then, the N-type layer 211 with an N-type impurity diffused therein, the P-type layer 212 with a P-type impurity diffused therein, and an N-type layer 213 with an N-type impurity diffused therein are sequentially laminated on the GaAs wafer substrate, thereby forming a wafer having the three-layer structure.

In the next step, the P-type impurity region 214 is selectively formed in a part of the N-type layer 213 with a photolithography method. Further, a groove is formed with a dry-etching method for separating elements. In the etching process, a part of the N-type layer 211 as the lowermost layer of the light emitting thyristor 210 is exposed, and a metal wiring portion is formed on the exposed portion of the N-type layer 211 to form the cathode K. At the same time, the anode A and the gate G are formed in the P-type impurity region 214 and the N-type layer 213, respectively.

As shown in FIG. 6(*c*), the modified example of the light emitting thyristor 210 has a four-layer structure formed of the N-type layer 211, the P-type layer 212, the N-type layer 213, and a P-type layer 215. The cathode K is formed in the N-type layer 211. The gate G is formed in the N-type layer 213. The anode A is formed in the P-type layer 215.

In the embodiment, the light emitting thyristor 210 with the four-layer structure uses, for example, a GaAs wafer substrate. A specific crystal is grown on an upper layer of the GaAs wafer substrate with the MOCVD (Metal Organic-Chemical Vapor Deposition) method through the following process, thereby forming the light emitting thyristor 210.

First, a sacrifice layer and a buffer layer (not shown) are grown on the GaAs wafer substrate through an epitaxial growth. Then, the N-type layer 211 with an N-type impurity diffused therein, the P-type layer 212 with a P-type impurity diffused therein, an N-type layer 213 with an N-type impurity diffused therein, and the P-type layer 215 with a P-type impurity diffused therein are sequentially laminated on the GaAs wafer substrate, thereby forming a wafer having the four-layer structure.

In the next step, a groove is formed with a dry-etching method for separating elements. In the etching process, a part of the N-type layer 211 as the lowermost layer of the light emitting thyristor 210 is exposed, and a metal wiring portion is formed on the exposed portion of the N-type layer 211 to form the cathode K. At the same time, a part of the P-type layer 215 as the uppermost layer of the light emitting thyristor 210 is exposed, and a metal wiring portion is formed on the exposed portion of the N-type layer 211 to form the anode A. Further, the gate G is formed in the N-type layer 213.

Figure 6A:
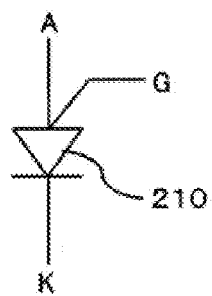
FIGS. 6(*a*) to 6(*d*) are schematic views showing a light emitting thyristor of the optical print head according to the first embodiment of the present invention, wherein FIG. 6(*a*) is a model diagram of the light emitting thyristor, FIG. 6(*b*) is a circuit diagram of the light emitting thyristor, FIG. 6(*c*) is a schematic sectional view of a modified example of the light emitting thyristor, and FIG. 6(*d*) is an equivalent circuit diagram of the light emitting thyristor.
Figure 6B:
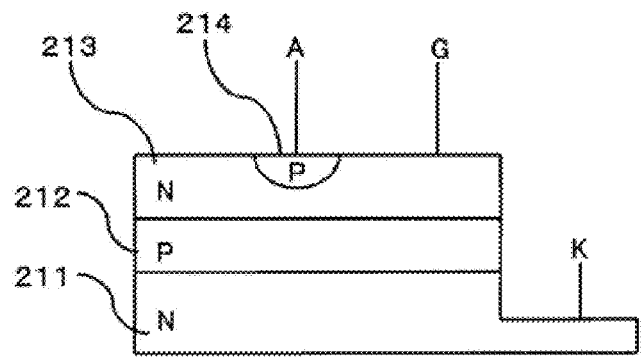
Figure 6C:
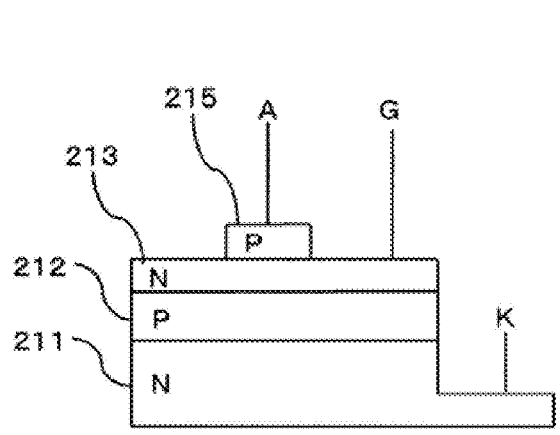
Figure 6D:
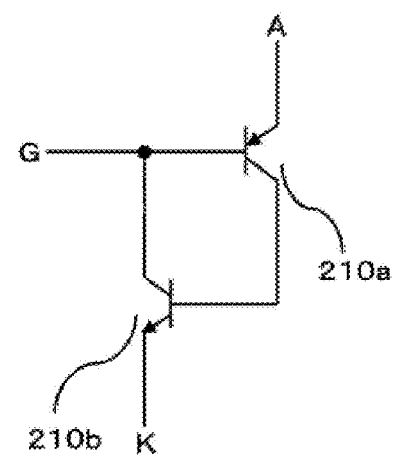

FIG. 6(d) is an equivalent circuit diagram of the light emitting thyristor 210 corresponding to FIGS. 6(b) and 6(c). As shown in FIG. 6(d), the light emitting thyristor 210 is formed of a PNP transistor 210a (referred to as a PTR) and an NPN transistor 210b (referred to as a NTR). An emitter of the PTR 210a corresponds to the anode A of the light emitting thyristor 210. A base of the PTR 210a corresponds to the gate G of the light emitting thyristor 210, and is connected to a base of the NTR 210b. An emitter of the NTR 210b corresponds to the cathode K of the light emitting thyristor 210.

In the embodiment, the light emitting thyristor 210 shown in FIGS. 6(a) to 6(d) has an AlGaAs layer formed on the GaAs wafer substrate, and is not limited thereto. Alternatively, the light emitting thyristor 210 may be formed of other semiconductor materials (for example, GaP, GaAsP, AlGaInP, and the likes). Further, a semiconductor material (for example, GaN, AlGaN, and the likes) may be formed on a sapphire substrate.

In the embodiment, a composite chip is formed of the light emitting thyristors 210 (210-1 to 210-192) and the driver IC 100 (100-1 to 100-26) as the drive elements. The composite chip is produced through the following process.

First, the light emitting thyristors 210 are attached to an IC wafer with the driver ICs 100 arranged thereon with an epitaxial bonding method. Then, with the etching method, an unnecessary portion is removed and the terminal portions of the light emitting thyristors 210 are exposed. In the next step, the terminals of the light emitting thyristors 210 are connected to the terminals of the driver IC 100 using a thin layer wiring portion formed with the photolithography method. Then, the IC wafer is separated into a plurality of chips with a dicing method, thereby producing the composite chip formed of the light emitting thyristors 210 and the driver IC 100.

Figure 7:
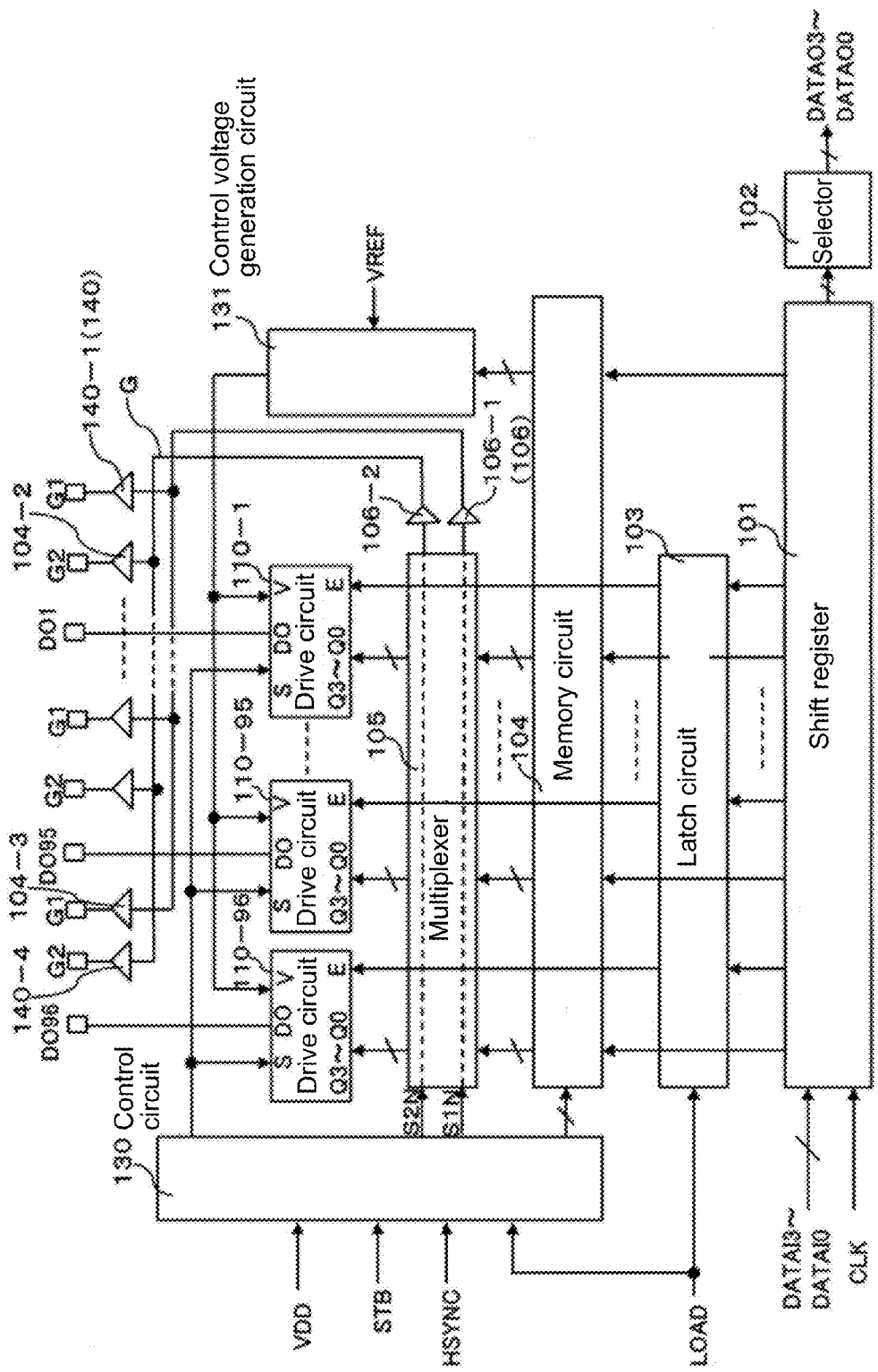
FIG. 7 is a block diagram showing a driver IC of the optical print head according to the first embodiment of the present invention.

A configuration of the driver IC 100 will be explained next. FIG. 7 is a block diagram showing the driver IC 100 of the optical print head 13 according to the first embodiment of the present invention.

As shown in FIG. 7, the driver IC 100 includes a shift register 101 formed of a plurality of FFs connected in a cascade arrangement. The shift register 101 retrieves the bit data DATAI3 to DATAI0 in synchronizing with the clock signal CLK for shifting. The shift register 101 is connected to a selector 102, a latch circuit 103, and a memory circuit 104 on an output side thereof. The selector 102 selects an output of the shift register 101, and outputs the bit data DATAI3 to DATAI0. The latch circuit 103 latches an output of the shift register 101 according to the latch signal LOAD.

In the embodiment, the memory circuit 104 stores correction data (dot correction data) for correcting a variance in a light amount of each of the light emitting thyristors 210; light amount correction data (chip correction data) for correcting a variance in a light amount of each of the light emitting element arrays 200; and specific data of the driver IC 100. The memory circuit 104 is connected to a multiplexer 105 on an output side thereof.

In the embodiment, the multiplexer 105 switches the dot correction data from the memory circuit 104 for the light emitting thyristors 210 arranged next to each other between on the odd number orders and the even number orders according to data switching instruction signals S1N and S2N. The multiplexer 105 is connected to a plurality (for example, 96) of drive circuits 110 (110-1 to 110-96) for driving the light emitting thyristors 210 on an output side thereof.

In the embodiment, a control voltage V is applied to each of the drive circuits 110. When each of the drive circuits 110 is turned on according to an on/off control signal S, each of the drive circuits 110 inputs output bit data E of the latch circuit 103 and output correction data Q3 to Q0 of the multiplexer 105. Further, each of the drive circuits 110 outputs an output signal DO for lighting the light emitting thyristor 210 to the DO96 to DO1 terminals of the IC driver 100 for driving the anode.

In the embodiment, the driver IC 100 further includes gate drive circuits 106 (106-1 and 106-2) for driving and controlling the gate G of each of the light emitting thyristors 210; a plurality (for example, 96×2) of gate drive individual circuits 140 (140-1 to 140-4, . . . ); a control circuit 130; and a control voltage generation circuit 131.

In the embodiment, the gate drive circuits 106-1 and 106-2 drive the data switching instruction signals S1N and S2N, respectively. The gate drive circuit 106-1 is connected to a plurality (for example, 96) of the gate drive individual circuits 140 (140-1, 140-3, . . . ) on an output side thereof. The gate drive circuit 106-2 is connected to a plurality (for example, 96) of the gate drive individual circuits 140 (140-2, 140-4, . . . ) on an output side thereof. The gate drive individual circuits 140 (140-1, 140-3, . . . ) are connected to the G1 terminal of the IC driver 100 on an output side thereof for driving the gate. The gate drive individual circuits 140 (140-2, 140-4, . . . ) are connected to the G2 terminal of the IC driver 100 on an output side thereof for driving the gate.

In the embodiment, the control circuit 130 has a function of generating and supplying the on/off control signal S to the drive circuits 110 according to the strobe signal STB and the latch signal LOAD upon receiving the power source voltage VDD, the strobe signal STB, the synchronization signal HSYNC, and the latch signal LOAD. The control circuit 130 further has a function of generating a writing instruction signal for writing the correction data into the memory circuit 104 according to the strobe signal STB and the latch signal LOAD.

Further, the control circuit 130 has a function of generating the data switching instruction signals S1N and S2N between the odd number dot data and the even number dot data to the multiplexer 105 and the buffers 106-1 and 106-2 according to the synchronization signal HSYNC and the latch signal LOAD. The control voltage generation circuit 131 generates the control voltage V for operating the drive circuits 110 according to the reference voltage VREF.

In the driver IC 100, according to the clock signal CLK, the bit data DATAI0 to DATAI3 for 4,992 dots are sequentially transmitted in the shift register 101. Then, according to the latch signal LOAD, the bit data DATAI0 to DATAI3 for 4,992 dots are latched with the latch circuit 103.

In the next step, according to the correction data Q3 to Q0 and the strobe signal STB, the drive circuits 110-1 to 110-96 output an anode drive current corresponding to the dot data DO1 to DO96. At the same time, the individual circuits 140-1, 140-3, . . . and the individual circuits 140-2, 140-4, . . . output a gate drive current through the buffers 106-1 and 106-2, thereby lightening the light emitting thyristors 210 corresponding to the dot data DO1, . . . at the H level.

Figure 8:
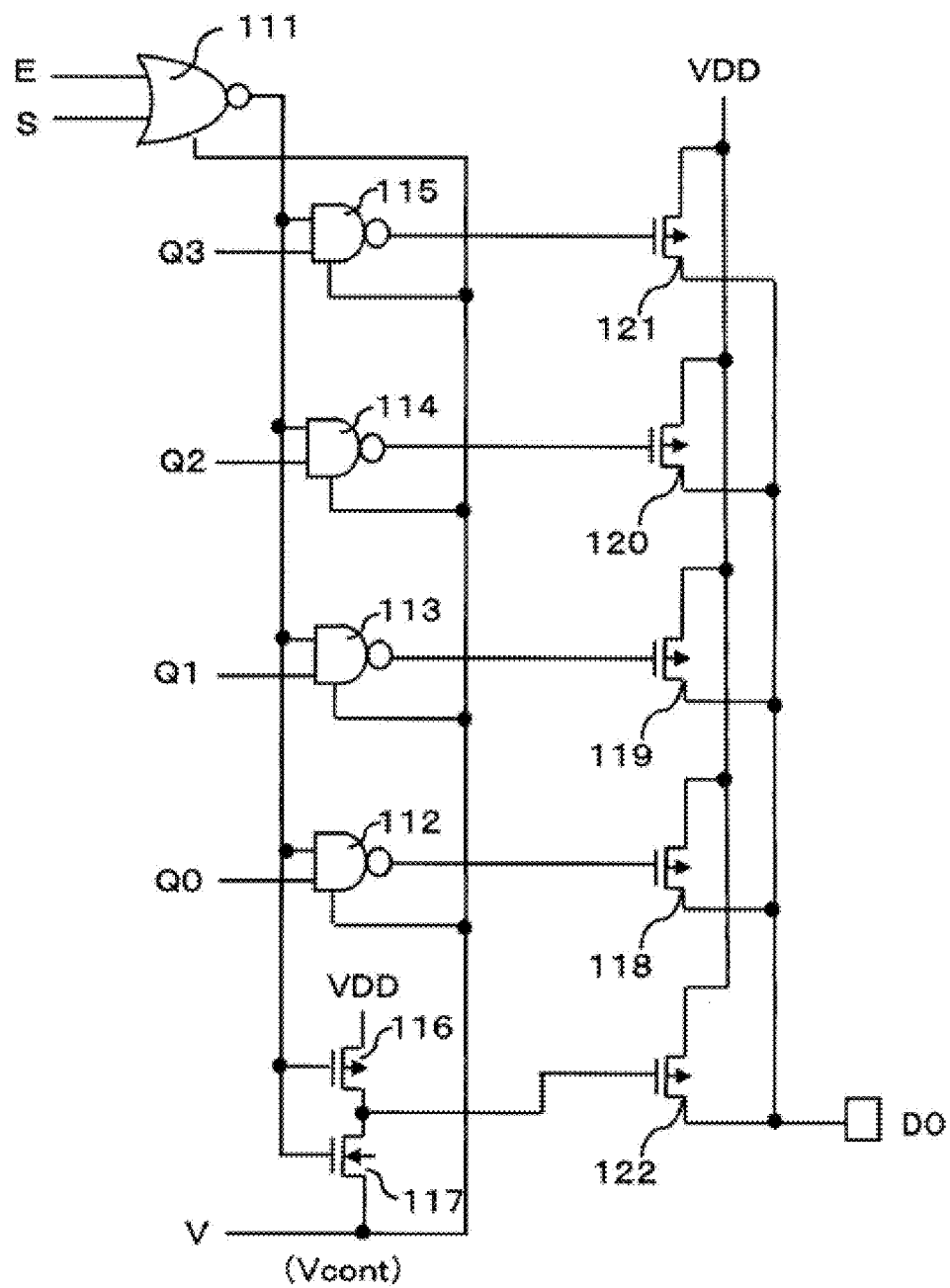
FIG. 8 is a circuit diagram showing a drive circuit of the driver IC according to the first embodiment of the present invention.

A configuration of the drive circuit 110 will be explained next. FIG. 8 is a circuit diagram showing the drive circuit 110 of the driver IC 100 according to the first embodiment of the present invention.

As shown in FIG. 8, the drive circuit 110 includes an NOR circuit 111 for calculating a negative logical disjunction (referred to as NOR) between bit data E of negative logic output from the latch circuit 103 and the on/off control signal S of negative logic from the control circuit 130. The nor circuit 111 is connected to input sides of four negative logical disjunction circuits (referred to as NAND circuits) 112 to 115, and gates of a P-channel MOS transistor 116 (referred to as a PMOS) and an N-channel MOS transistor 117 (referred to as an NMOS) constituting an inverter.

In the embodiment, the NAND circuits 112 to 115 obtain a negative logical disjunction between output data of the NOR circuit 111 and the correction data from the multiplexer 105. In the NOR circuit 111 and the NAND circuits 112 to 115, a power source terminal thereof is connected to a terminal and a power source voltage VDD (not shown), and a ground terminal thereof is connected to a terminal of the control voltage V to be maintained at a control voltage Vcon. The PMOS 116 and the NMOS 117 constituting the inverter are connected in series between the terminal of the power source voltage VDD and the terminal of the control voltage V for inverting and outputting an output signal of the NOR circuit 111.

In the embodiment, the NAND circuits 112 to 115 are connected to gates of PMOS 118 to 121 on an output side thereof, and drains of the PMOS 116 and the NMOS 117 are connected to a gate of PMOS 122. The terminal of the power source voltage VDD is commonly connected to sources of the PMOS 118 to 121, and a drive current output terminal for the dot data DO is commonly connected to drains of the PMOS 118 to 121. The drive current output terminal is further connected to the anodes of the light emitting thyristors 210 through a thin layer wiring portion (described later) and the likes.

As described later, a potential between the power source voltage VDD and the control voltage Vcont is substantially equal to a voltage between the gates and the sources of the PMOS 118 to 122 when the PMOS 118 to 122 are turned on. It is possible to adjust a drain current of the PMOS 118 to 122 through changing the voltage between the gates and the sources. When the control voltage generation circuit 131 shown in FIG. 7 receives the reference voltage Vref, the control voltage generation circuit 131 controls the control voltage Vcon so that the drain current of the PMOS 18 to 122 becomes a specific level.

A function of the drive circuit 110 will be explained next. When the bit data E or the print data from the latch circuit 103 is on (that is, a low level, referred to as an L level), the on/off control signal S from the latch circuit 103 becomes the L level, and drive-on is instructed, an output of the NOR circuit 111 becomes the H level. At this moment, according to the correction data Q3 to A0 from the multiplexer 105, an output signal of the NAND circuit 112 to 115 and an output of the inverter formed of the PMOS 116 and the NMOS 117 becomes the level of the power source voltage VDD or the control voltage Vcon.

In the embodiment, the PMOS 122 is a main drive transistor for supplying a main drive current to the light emitting thyristor 210, and the PMOS 118 to 121 are auxiliary drive transistors for adjusting the drive current of the light emitting thyristor 210 to correct the light amount per dot. The PMOS 122 as the main drive transistor is driven according to the print data. The PMOS 118 to 121 as the auxiliary drive transistors are selectively driven according to the correction data Q3 to Q0 from the multiplexer 105 when the output of the NOR circuit 111 is the H level. The correction data Q3 to Q0 are used for correcting the variance in the light amount of the light emitting thyristor 210 per dot, and are stored in the memory circuit 104 shown in FIG. 7. The multiplexer 105 selects and supplies the correction data Q3 to Q0.

More specifically, as well as the PMOS 122 as the main drive transistor, the PMOS 118 to 121 as the auxiliary drive transistors are selectively driven according to the correction data Q3 to Q0. Accordingly, the drain current of each of the PMOS 118 to 121 as the auxiliary drive transistors is added to the drain current of the PMOS 122 as the main drive transistor to obtain the drive current. Then, the drive current is output from the drive current output terminal of the dot data DO and supplied to the anodes A of the light emitting thyristors 210.

When the PMOS 118 to 121 as the auxiliary drive transistors are driven, the output of the NAND circuits 112 to 115 is the L level (that is, substantially equal to the control voltage Vcon). Accordingly, the gate potential of the PMOS 118 to 121 is substantially equal to the control voltage Vcon. At this moment, the PMOS 116 is in an off state and the NMOS 117 is in an on state, so that the gate potential of the PMOS 122 is also substantially equal to the control voltage Vcon. Accordingly, it is possible to collectively adjust the drain current of the PMOS 118 to 122 through the control voltage Vcon.

Figure 9A:
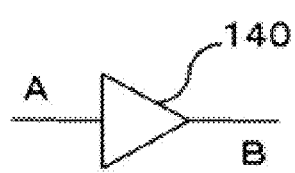
FIGS. 9(*a*) to 9(*d*) are views showing an individual circuit of the driver IC for driving a gate according to the first embodiment of the present invention, wherein FIG. 9(*a*) is a model diagram of the individual circuit, FIG. 9(*b*) is a circuit diagram of the individual circuit, FIG. 9(*c*) is a schematic sectional view of an IC chip of the individual circuit, and FIG. 9(*d*) is an equivalent circuit diagram of the individual circuit.
Figure 9B:
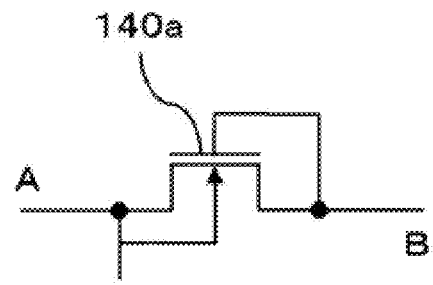
Figure 9C:
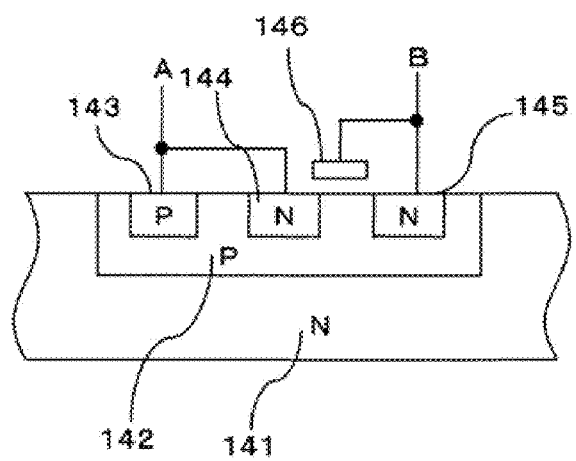
Figure 9D:
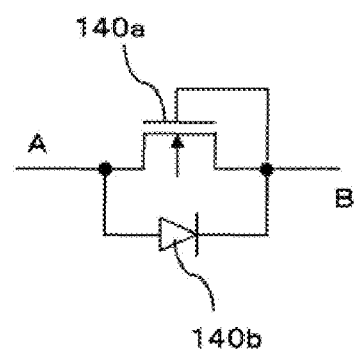

A configuration of the individual circuit 140 will be explained next. FIGS. 9(a) to 9(d) are views showing the individual circuit 140 of the driver IC 100 for driving the gate according to the first embodiment of the present invention. More specifically, FIG. 9(a) is a model diagram of the individual circuit 140, FIG. 9(b) is a circuit diagram of the individual circuit 140, FIG. 9(c) is a schematic sectional view of an IC chip of the individual circuit 140, and FIG. 9(d) is an equivalent circuit diagram of the individual circuit 140.

As shown in FIG. 9(a), the individual circuit 140 includes a first terminal A and a second terminal B.

As shown in FIG. 9(b), the individual circuit 140 is formed of, for example, an NMOS 140a. A source of the NMOS 140a is connected to the first terminal A, and drain and source of the NMOS 140a are connected to the second terminal B. A substraight of the NMOS 140a is connected to the source thereof.

FIG. 9(c) is the schematic sectional view showing the NMOS 140a of the individual circuit 140 taken along a channel direction thereof. The NMOS 140a is produced through the following process.

A chip substrate 141 contains an N-type impurity, and the driver IC 100 is formed on the chip substrate 141. A P-type impurity is introduced into a specific location of the chip substrate 141 to form a P-well region 142. In the P-well region 142, there are arranged a sub-straight contact region 143 formed through diffusion of a P-type impurity, and a source region 144 and a drain region 145 formed through diffusion of an N-type impurity.

Further, a gate 146 formed of a poly-silicon is disposed between the source region 144 and the drain region 145. The sub-straight contact region 143 and the N-type source region 144 are connected to the first terminal A. The drain region 145 and the gate 146 are connected to the second terminal B.

In FIG. 9(c), for simplifying the drawing, a gate oxide film, a contact hole, a passivation protective film, and the likes are omitted. A metal wiring portion connected to each of the impurity diffusion regions is represented with a solid line.

FIG. 9(d) is the equivalent circuit diagram of the individual circuit 140 formed of the NMOS 140a. As shown in FIG. 9(d), the individual circuit 140 includes the NMOS 140a shown in FIG. 9(b). An anode of a parasitic diode 140b is connected to the first terminal A on the source side of the NMOS 140a. A cathode of the parasitic diode 140b is connected to the second terminal B on the drain side and the gate side of the NMOS 140a. The parasitic diode 140b is formed of an PN junction created in an interface between the P-well region 142 and the N-type drain region 145 shown in FIG. 9(c).

Figure 10:
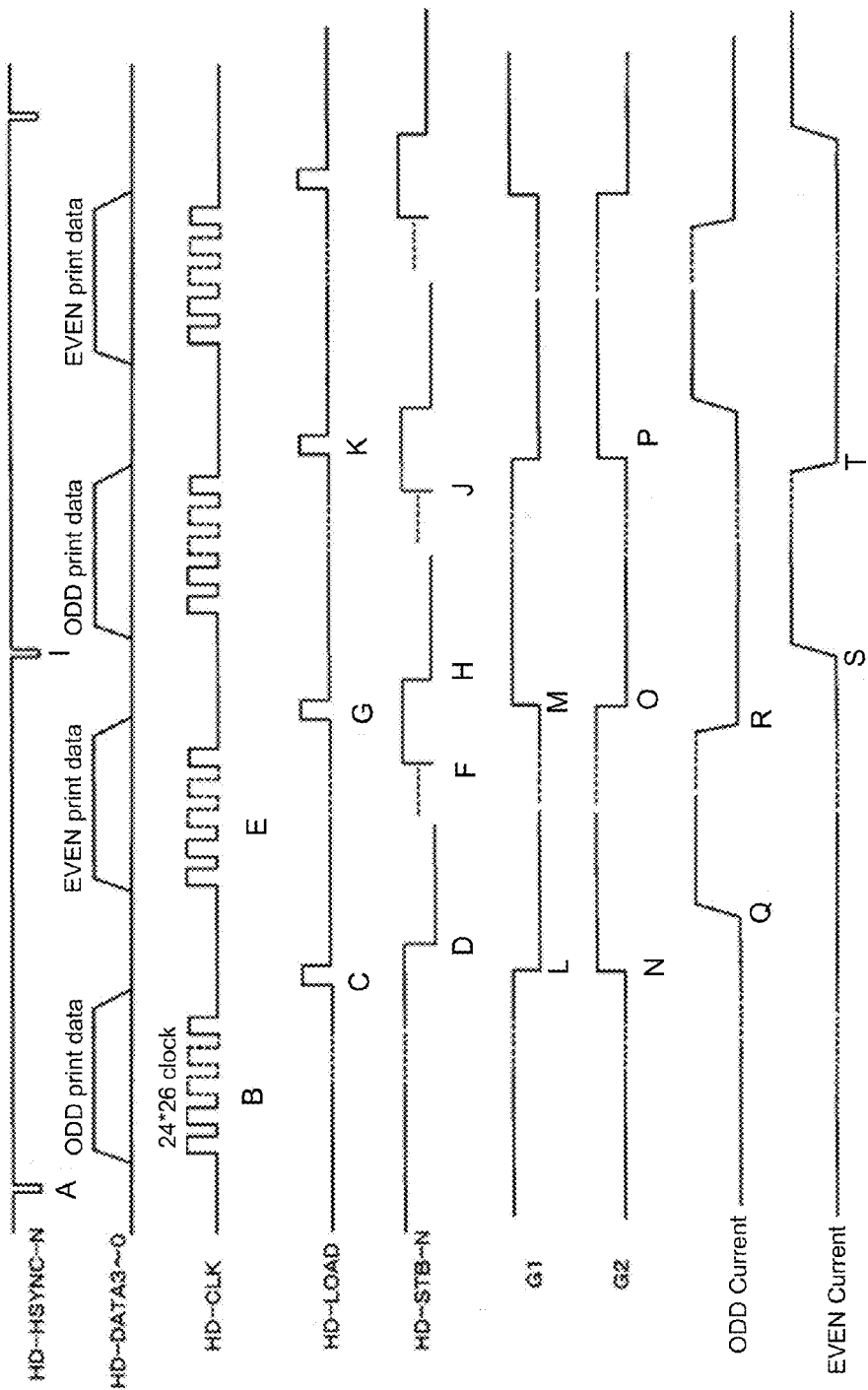
FIG. 10 is a time chart showing an operation of the optical print head according to the first embodiment of the present invention.

A printing operation using the optical print head 13 shown in FIGS. 1 and 7 will be explained next. FIG. 10 is a time chart showing the printing operation of the optical print head 13 according to the first embodiment of the present invention.

At a portion A of the time chart, the synchronization signal HD-HSYNC-N is input before the light emitting thyristors 210 are driven in the time division way. At a portion B, the print data signals HD-DATA3 to HD-DATA1 are input in synchronizing with the clock signal HD-CLK for transmitting drive data (ODD print data) of the light emitting thyristors 210 on the odd number orders.

In the embodiment, in the optical print head 13, 26 of the driver ICs 100-1 to 100-26 are connected in the cascade arrangement. Each of the driver ICs 100 includes 96 of terminals DO96 to DO1 for driving the light emitting thyristors 210. The print data for four pixels are concurrently transmitted with the clock signal HD-CLK of one pulse. Accordingly, the number of clock pulses necessary for one time data transmission is 264 (96/4×26=24×26=624).

When the drive data (ODD print data) of the light emitting thyristors 210 on the odd number orders are completely transmitted at the portion B, the latch signal HD-LOAD is input at a portion C, so that the latch circuit 103 latches the data input through the shift register 101 formed of a plurality of FFs. At this moment, the G1 terminals of the light emitting thyristors 210 for driving the gates becomes the L level at a portion L, and the G2 terminals of the light emitting thyristors 210 for driving the gates becomes the H level at a portion N.

In the next step, at a portion D, the strobe signal HD-STB is input for instructing to drive the light emitting thyristors 210. Accordingly, the terminals DO1 to DO96 of the driver ICs selectively become the on state according to an instruction value of the print data, thereby outputting the drive current at a portion Q. Note that the G1 terminals of the light emitting thyristors 210-2, 210-4, . . . on the even number orders (refer to FIG. 1) are connected to the gates, thereby driving the light emitting thyristors 210-2, 210-4, . . . on the even number orders.

Accordingly, when the drive current is output from the terminal DO1 of the driver IC 100-1, a current path is created to the ground GND through the anode and the cathode of the light emitting thyristor 210-4. In the light emitting thyristor 210-3 arranged next to the light emitting thyristor 210-4, the gate thereof becomes the H level and the off state. Accordingly, the drive current from the terminal DO1 of the driver IC 100-1 does not flow, so that the light emitting thyristor 210-3 does not emit light. Accordingly, the light emitting thyristor 210-4 emits light, thereby forming the static latent image on the photosensitive member 11 shown in FIG. 2 to form a print dot.

In the next step, when the strobe signal HD-STB-N of negative logic becomes the H level at a portion F, the driver ICs 100 stops driving, so that all of the light emitting thyristors 210 are turned off at a portion R.

In the next step, the print data signals HD-DATA3 to HD-DATA0 are input in synchronizing with the clock signal HD-CLK for transmitting drive data (EVEN print data) of the light emitting thyristors 210 on the even number orders at a portion E.

As described above, in the optical print head 13 in the embodiment, 26 of the driver ICs 100-1 to 100-26 are connected in the cascade arrangement. Each of the driver ICs 100 includes 96 of terminals DO96 to DO0 for driving the light emitting thyristors 210. The print data for four pixels are concurrently transmitted with the clock signal HD-CLK of one pulse. Accordingly, the number of clock pulses necessary for one time data transmission is 264 (96/4×26=24×26=624).

When the drive data (EVEN print data) of the light emitting thyristors 210 on the even number orders are completely transmitted at the portion E, the latch signal HD-LOAD is input at a portion G, so that the latch circuit 103 latches the data input through the shift register 101. At this moment, the G1 terminals of the light emitting thyristors 210 for driving the gates becomes the H level at a portion M, and the G2 terminals of the light emitting thyristors 210 for driving the gates becomes the L level at a portion O.

In the next step, at a portion H, the strobe signal HD-STB is input for instructing to drive the light emitting thyristors 210. Accordingly, the terminals DO1 to DO96 of the driver ICs selectively become the on state according to an instruction value of the print data, thereby outputting the drive current at a portion S. Note that the G2 terminals of the light emitting thyristors 210-1, 210-3, . . . on the odd number orders are connected to the gates, thereby driving the light emitting thyristors 210-1, 210-3, . . . on the odd number orders.

Accordingly, when the drive current is output from the terminal DO1 of the driver IC 100-1, a current path is created to the ground GND through the anode and the cathode of the light emitting thyristor 210-3. In the light emitting thyristor 210-4 arranged next to the light emitting thyristor 210-3, the gate thereof becomes the H level and the off state. Accordingly, the drive current from the terminal DO1 of the driver IC 100-1 does not flow, so that the light emitting thyristor 210-4 does not emit light. Accordingly, the light emitting thyristor 210-3 emits light, thereby forming the static latent image on the photosensitive member 11 shown in FIG. 2 to form a print dot.

In the next step, when the strobe signal HD-STB-N of negative logic becomes the H level at a portion J, the driver ICs 100 stops driving, so that all of the light emitting thyristors 210 are turned off at a portion T.

As described above, among the light emitting thyristors 210, the light emitting thyristors 210-1, 210-3, . . . on the odd number orders and the light emitting thyristors 210-2, 210-4, . . . on the even number orders are driven in the time division way, thereby driving the light emitting thyristors 210 for one line.

Figure 11:
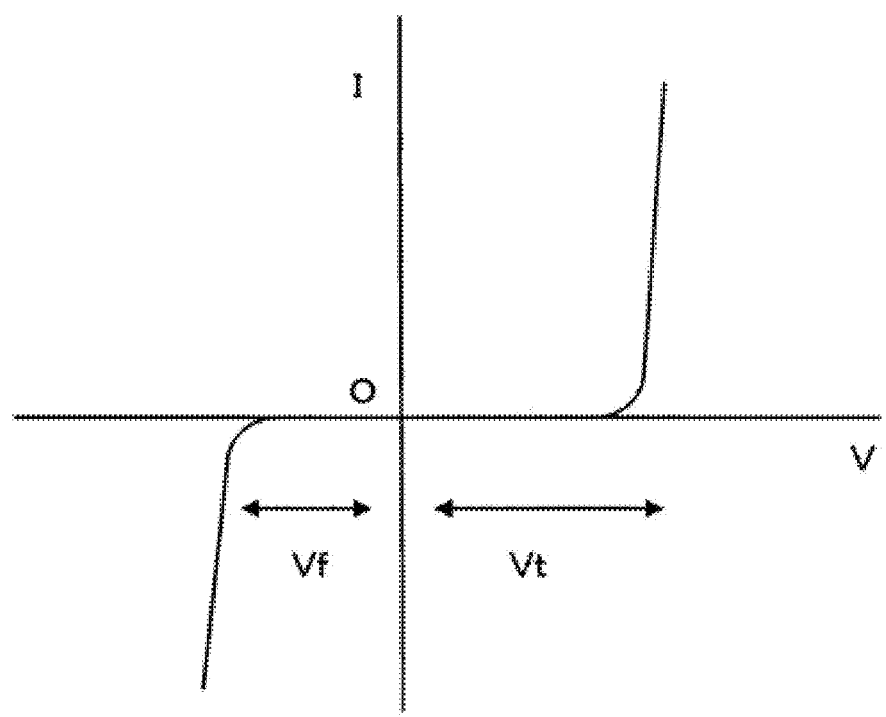
FIG. 11 is a graph showing a relationship between a voltage and a current of the individual circuit according to the first embodiment of the present invention.

An operation of the individual circuit 140 for driving the gate will be explained next. FIG. 11 is a graph showing a relationship between a voltage and a current of the individual circuit 140 according to the first embodiment of the present invention. In FIG. 11, the vertical axis represents a voltage applied to the second terminal B with reference to the first terminal A, and a horizontal axis represents a current flowing between the second terminal B and the first terminal A.

As shown in FIG. 9(b), the NMOS 140a has the gate connected to the drain thereof. Accordingly, the voltage applied between the second terminal B and the first terminal A is equal to a voltage between the gate and the source of the NMOS 140a. When a potential of the second terminal B exceeds a threshold voltage Vt of the NMOS 140a over a potential of the first terminal A, a current flows from the second terminal B to the first terminal A.

As shown in FIGS. 9(b) and 9(c), the first terminal A is connected to the sub-straight of the NMOS 140a and conducted with the P-type sub-straight contact region 143 in the P-well 142. The drain of the NMOS 140a is connected to the drain region 145 in the P-well 142. Accordingly, in the equivalent circuit diagram shown in FIG. 9(d), the parasitic diode 140b is created between the first terminal A and the second terminal B.

When an anode potential on the side of the first terminal A exceeds a forward voltage Vf of the parasitic diode 140b over a cathode potential on the side of the second terminal B, a current flows from the first terminal A to the second terminal B. As a result, the relationship between the voltage and the current of the individual circuit 140 is obtained. Accordingly, depending on the direction of the potential thus applied, a level shift circuit with both polarities is constituted for shifting a voltage corresponding to the threshold voltage Vt of the NMOS 140a and the forward voltage Vf of the parasitic diode 140b.

As explained above, in the individual circuit 140 shown in FIGS. 9(a) to 9(d), depending on the output signal level of the buffer 160 for driving the individual circuit 140, when the level of the first terminal A is the H level and substantially equal to the power source voltage VDD (for example, 5 V), the second terminal B outputs a voltage (for example, 4.4 V) smaller by the forward voltage Vf (for example, 0.6 V). Further, when the level of the first terminal A is the L level and substantially equal to the ground potential (for example, 0 V), the second terminal B outputs a voltage (for example, 1 V) greater by the threshold voltage Vt (for example, 1 V). Accordingly, the individual circuit 140 is capable of transmitting the logic states, i.e., both the H level and the L level, of the buffer 160 for driving the individual circuit 140 to the gate of the light emitting thyristor 210.

Figure 12A:
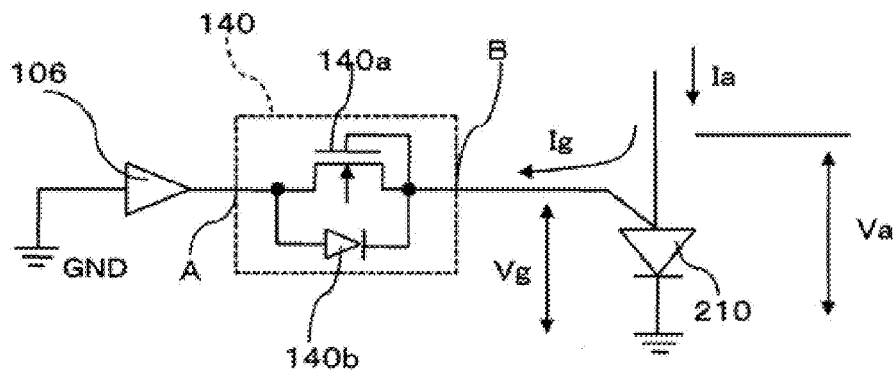
Figure 12B:
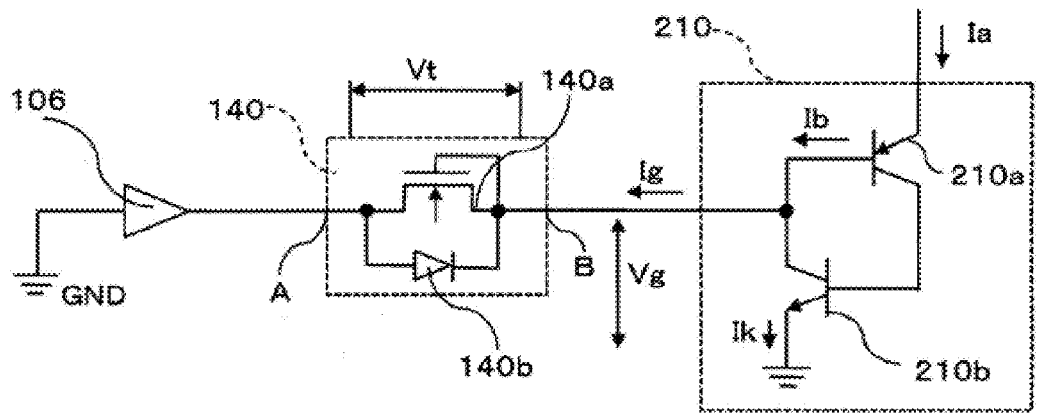
Figure 12C:
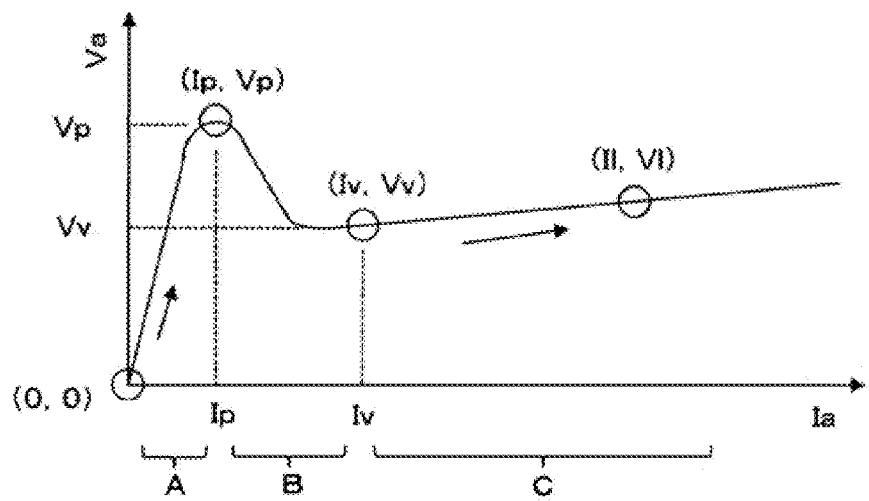

An operation of the light emitting thyristor 210 in a turn-on process will be explained next. FIGS. 12(a) to 12(c) are views showing the operation of the light emitting thyristor 210 in the turn-on process according to the first embodiment of the present invention. More specifically, FIGS. 12(a) and 12(b) are circuit diagrams showing the operation of the buffer 160, the individual circuit 140 shown in FIG. 9(d), and the light emitting thyristor 210 shown in FIG. 6(d) in the turn-on process. FIG. 12(c) is a graph showing a waveform of the light emitting thyristor 210 in the turn-on process.

In FIG. 12(c), the vertical axis represents an anode current Ia, and the horizontal axis represents an anode potential Va. In FIGS. 12(a) to 12(c), Vt represents a voltage between the gate and the source of the NMOS 140a; Ib represents a base current of the PTR 210a; Ig represents a gate current of the light emitting thyristor 210; Vg of a gate voltage of the light emitting thyristor 210; and Ik is a cathode current of the light emitting thyristor 210.

In FIG. 12(a), it is supposed that the input voltage of the buffer 106 is the L level for explaining the turn-on process of the light emitting thyristor 210. The anode current Ia is output from the terminal DO of the driver IC 100 shown in FIG. 7 for driving the light emitting thyristor 210. At this moment, the output voltage of the buffer 106 is the L level. Accordingly, the base current Ib flows between the emitter and the base of the PTR 210a due to the anode current Ia flowing in from the anode of the light emitting thyristor 210. The base current Ib further flows between the drain and the source of the NMOS 140a of the individual circuit 140 as the gate current Ig, and flows into the output terminal of the buffer 106.

At this moment, the voltage between the gate and the source of the NMOS 140a is slightly greater than the threshold voltage Vt. When the drain current is small, however, the voltage becomes substantially the same as the threshold voltage Vt. Accordingly, the voltage between the gate and the source is represented as Vt in FIG. 12(b). Since the output voltage of the buffer 106 is the L level and substantially equal to the ground potential, i.e., 0 V, the gate potential Vg of the light emitting thyristor 210 is substantially equal to the forward voltage Vt.

In FIG. 12(b), the gate current Ig corresponds to the base current Ib of the PTR 210a of the light emitting thyristor 210. When the base current Ib flows, the PTR 210a starts moving to the on state, thereby generating a collector current in the collector of the PTR 210a. The collector current becomes a base current of the NTR 210b, so that the NTR 210b becomes the on state, thereby generating a collector current in the collector of the NTR 210b. The collector current is then added to the base current Ib of the PTR 210a, thereby accelerating the PTR 210a to move to the on state.

After the NTR 210b completely becomes the on state, a voltage between the collector and the emitter thereof decreases and becomes a potential smaller than the threshold voltage Vt of the NMOS 140a. Accordingly, the gate current Ig flowing from the gate of the light emitting thyristor 210 to the second terminal B of the individual circuit 140 becomes substantially zero. Further, the cathode current Ik substantially equal to the anode current Ia flows in the cathode of the light emitting thyristor 210, so that the light emitting thyristor 210 completely becomes the on state.

The turn-on process of the light emitting thyristor 210 is shown in FIG. 12(c). When the light emitting thyristor 210 does not emit light, the anode current Ia is substantially zero in a state at an origin (0, 0) of the graph shown in FIG. 12(c). When the turn-on process of the light emitting thyristor 210 starts and the anode is driven, the anode potential Va increases and reaches a potential Vp indicated with an arrow in FIG. 12(c). The potential Vp corresponds a sum of the threshold voltage Vt of the NMOS 140a and the a voltage Vbe between the emitter and the base of the PTR 210a. When the potential Vp is applied in the forward direction, a gate current (equal to the base current Ib of the PTR 210a) is generated. In FIG. 12(c), a point (Ip, Vp) corresponds to a boundary between an off region A and an on transition region B of the light emitting thyristor 210.

When the anode current Ia increases, the anode potential Va decreases and reaches a point (Iv, Vv). The point (Iv, Vv) corresponds to a boundary between the on transition region B and an on region C of the light emitting thyristor 210. At the moment, the gate current Ig becomes substantially zero, and the individual circuit 140 is in an equivalent state that the individual circuit 140 is substantially disconnected from the light emitting thyristor 210. When the anode current Ia further increases, the anode potential Va increases and reaches a point (Il, Vl). The point (Il, Vl) corresponds to a final point of the light emitting thyristor 210 in the light emitting drive, and the light emitting thyristor 210 is driven to emit light at specific light power according to the anode current Ia supplied from the driver IC 100.

As described above, the turn-on process of the light emitting thyristor 210 is explained with reference to FIG. 12(c). In the embodiment, the individual circuit 140 is provided for preventing the gate current Ig from flowing from the light emitting thyristor 210 in the light emitting state. Accordingly, it is possible to achieve the on state drive with the anode current Ia and the cathode current Ik being substantially equal, and to obtain light power according to the anode current Ia thus adjusted. In the embodiment, the individual circuit 140 is provided between the output side of the buffer 106 and the gate of the light emitting thyristor 210, thereby obtaining the effect described above.

On the other hand, in a conventional configuration, when a buffer formed of a CMOS circuit is directly connected to a gate of a light emitting thyristor, an L level output thereof decreases substantially to zero potential. Accordingly, a base current of a PTR continues to flow toward the CMOS buffer as a gate current, thereby decreasing a collector current of an NTR and a cathode current of the light emitting thyristor. As a result, a light output of the light emitting thyristor varies, and it is difficult to operate the light emitting thyristor in a desired state, and to use the light emitting thyristor in an optical print head.

In the embodiment, the optical print head 13 includes the configuration shown in FIGS. 12(a) and 12(b) using the buffer 106 for driving the gate, thereby solving the problem of the conventional configuration. Further, it is not necessary to provide a power MOS transistor of a conventional circuit, thereby reducing a size and cost of the optical print head 13.

Figure 13A:
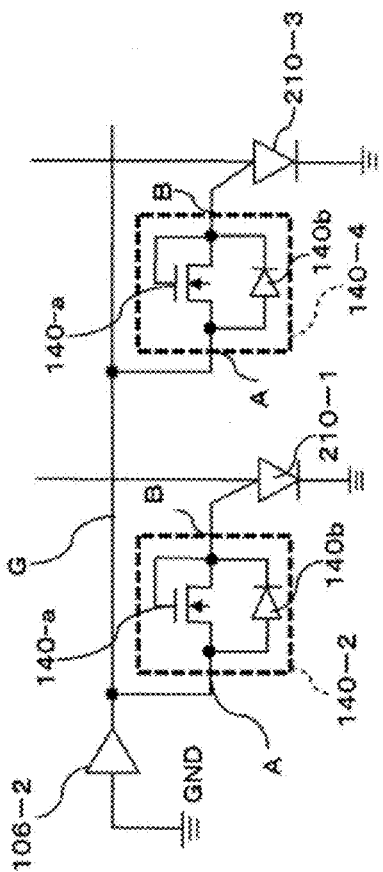
FIGS. 13(a) and 13(b) are circuit diagrams showing an operation of the light emitting thyristors concurrently emitting light according to the first embodiment of the present invention.
Figure 13B:
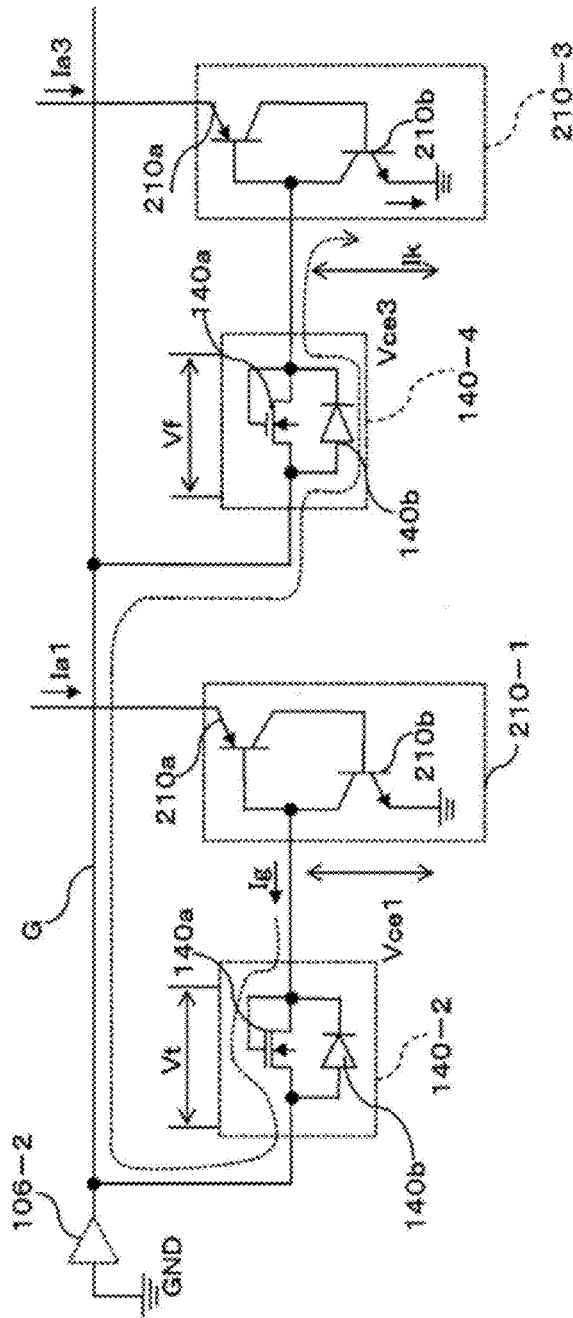

An operation of the light emitting thyristors 210 concurrently emitting light will be explained next. FIGS. 13(a) and 13(b) are circuit diagrams showing the operation of the light emitting thyristors 210 concurrently emitting light according to the first embodiment of the present invention. FIGS. 13(a) and 13(b) show a connection state of the individual circuits 140 for driving the gates and the light emitting thyristors 210. In FIGS. 13(a) and 13(b), for an explanation purpose, only two individual circuits 140-2 and 140-4 and two light emitting thyristors 210-1 and 210-3 are shown.

The common buffer 106-2 has the input voltage at the L level upon on control of the light emitting thyristors 210-1 and 210-3, so that the input voltage is represented as a state connected to the ground GND in FIGS. 13(a) and 13(b). The output side of the buffer 106-2 is connected to a common gate wiring portion G as a common base line, and the common gate wiring portion G is connected to the first terminals A of the individual circuits 140-2 and 140-4. The second terminals B of the individual circuits 140-2 and 140-4 are connected to the gates of the light emitting thyristors 210-1 and 210-3, respectively.

As described above, the individual circuits 140-2 and 140-4 are formed of the NMOSs 140a and the parasitic diodes 140b. The light emitting thyristors 210-1 and 210-3 are formed of the PTRs 210a and the NTRs 210b. In FIG. 13(b), Vce1 represents a voltage between the collector and the emitter of the NTR 210b of the light emitting thyristor 210-1, and Vce3 represents a voltage between the collector and the emitter of the NTR 210b of the light emitting thyristor 210-3.

FIG. 13(b) shows a state that the light emitting thyristors 210-1 and 210-3 are concurrently turned on. As described above with reference to FIGS. 12(a) and 12(b), in the individual circuit 140-2, after the voltage level of the second terminal B becomes the L level for the turn-on instruction of the light emitting thyristor 210-1, and the light emitting thyristor 210-1 is turned on, it is possible to make the current flowing from the gate of the light emitting thyristor 210-1 to the second terminal B of the individual circuit 140-2 substantially zero. Accordingly, in FIG. 13(b), it is possible to ignore an influence of the buffer 160-2 connected to the common gate wiring portion G, so that the common gate wiring portion G is represented with a hidden line in FIG. 13(b).

When the light emitting thyristor 210-1 is turned on, and a drive current Ia1 flows in the anode thereof, the gate current Ig of the light emitting thyristor 210-1 flows an arrow path in FIG. 13(b).

When it is assumed that the gate current Ig flows, the gate current Ig flows between the emitter and the base of the PTR 210a of the light emitting thyristor 210-1. After the gate current Ig flows between the drain and the source of the NMOS 140a of the individual circuit 140-2 and a voltage decreases by the threshold voltage Vt, the gate current Ig flows through the parasitic diode 140b of the individual circuit 140-4 in the forward direction through the common gate wiring portion G, so that a voltage decreases by the forward voltage Vf. Afterward, the gate current Ig flows to the ground GND through the collector and the emitter of the NTR 210b of the light emitting thyristor 210-3.

Accordingly, a potential Vg between the gate of the light emitting thyristor 210-1 and the flow out side of the gate current Ig is given by $$Vg=Vt+Vf+Vce3$$

The voltage Vce1 between the collector and the emitter of the NTR 210b of the light emitting thyristor 210-1 is smaller than the calculated value of the gate voltage Vg. Accordingly, the base current Ib flowing through the base of the PTR 210b of the light emitting thyristor 210-1 does not flow the arrow path. Instead, the base current Ib merges the cathode current Ik of the PTR 210b as the collector current of the PTR 210b of the light emitting thyristor 210-1.

As shown in FIGS. 1 to 7, when the light emitting thyristors 210-1 and 210-3 emit light concurrently, since the gates thereof are connected to the individual circuits 140-2 and 140-4, respectively, a current component is not generated between the gates of the light emitting thyristors 210-1 and 210-3. As a result, the anode currents Ia1 and Ia3 supplied to the light emitting thyristors 210-1 and 210-3 flow between the anodes and the cathodes of the light emitting thyristors 210-1 and 210-3 as the cathode current Ik, so that the anode currents Ia1 and Ia3 are equal to the cathode current Ik. Accordingly, it is possible to adjust light power of the light emitting thyristors 210-1 and 210-3 only through the anode currents Ia1 and Ia3. That is, it is possible to arbitrarily adjust light power through adjusting the anode currents Ia1 and Ia3.

As described above, in the embodiment, similar to a conventional LED print head using LEDs, it is possible to adjust light power through the drive current. Further, it is possible to eliminate the power MOS transistor necessary in the conventional configuration, thereby reducing a size and cost of the optical print head 13.

Figure 14:
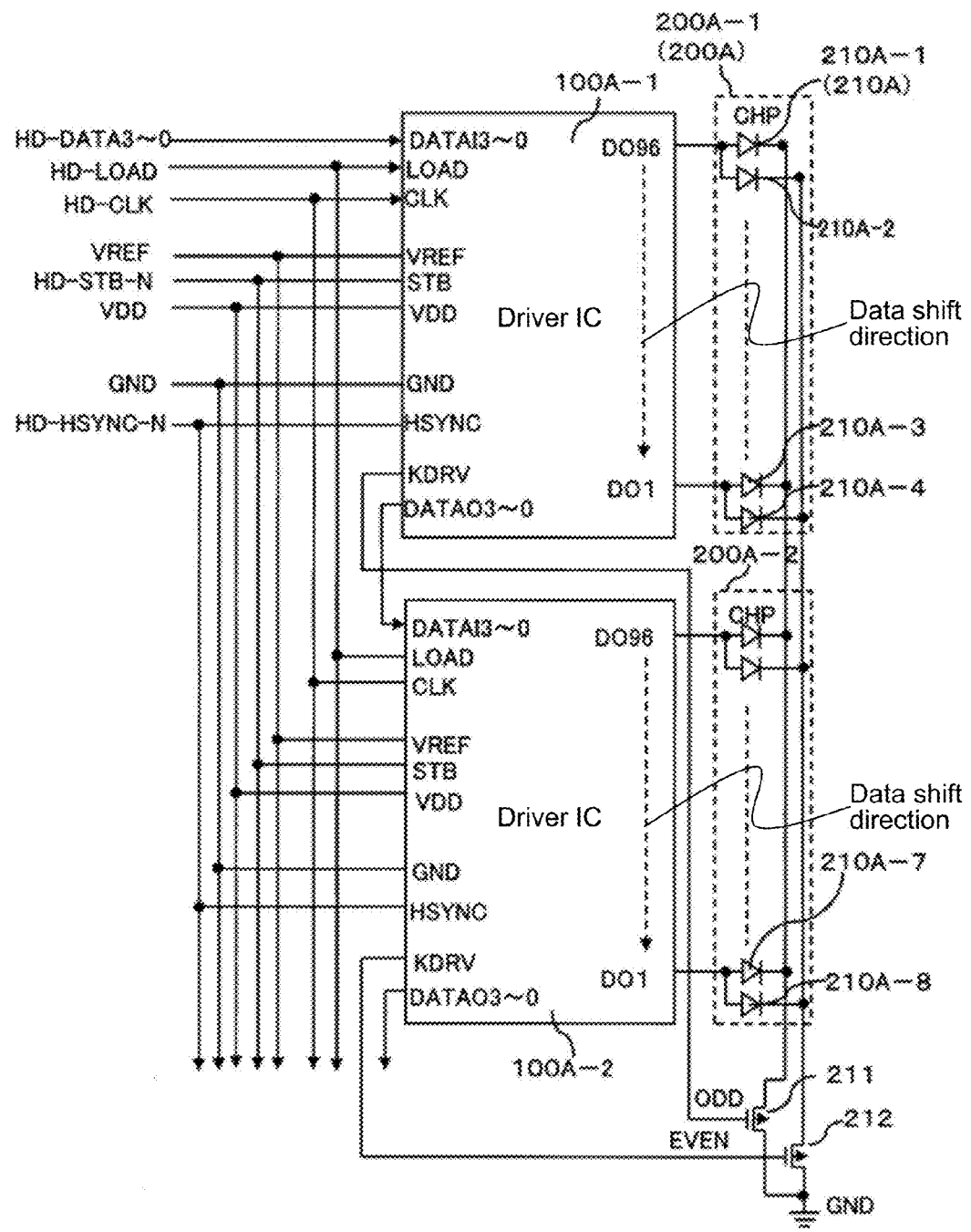
FIG. 14 is a block diagram showing a configuration of a conventional optical print head.

An effect of the embodiment will be explained next in comparison with a configuration of a conventional LED print head. FIG. 14 is a block diagram showing the configuration of the conventional LED print head. In FIG. 14, components similar to those in the embodiment are designated with the same reference numerals.

As shown in FIG. 14, the conventional LED print head includes a plurality of driver ICs 100A (100A-1, 100A-2, ...) instead of the driver ICs 100 (100-1, 100-2, ...) shown in FIG. 1. Further, the conventional LED print head includes a plurality of LED arrays 200A (200A-1, 200A-2, . . . ) instead of the light emitting element arrays 200 (200-1, 200-2, . . . ) shown in FIG. 1.

In the conventional LED print head, each of the LED arrays 200A includes a plurality of LEDs 210A (210A-1, 210A-2, . . . ). Two of the LEDs 210A form one pair. Anodes of the LEDs 210A are connected to terminals DO1 to DO96 of each of the driver ICs 100A, and cathodes of the LEDs 210A are commonly connected to the ground GND through an odd number side power MOS transistor 211 and an even number side power MOS transistor 212. When the power MOS transistors 211 and 212 turned on and off, the LEDs 210A to be driven are switched in the time division way.

In the conventional LED print head having the LEDs 210A arranged in a matrix pattern, the number of the LEDs 210A may reach few thousands. When all of the LEDs 210A emit light, a large current flows through a common wiring portion.

In the conventional LED print head, the LEDs 210A are divided into a plurality of groups (for example, N groups), and the groups are driven in the time division way. The power MOS transistor 211 and 212 as switching elements are connected to the common wiring portion disposed in each of the groups for selecting the groups. It is necessary to provide the power MOS transistor 211 and 212 with a capability of driving a large current, thereby increasing a chip size of the power MOS increases 211 and 212. Accordingly, it is necessary to increase a size of an LED print head board for mounting the power MOS transistors 211 and 212, hereby making it difficult to reduce a size of the conventional LED print head. Further, it is necessary to mount the LEDs 210A, thereby increasing cost of the conventional LED print head.

Further, in the conventional LED print head, a drive current flows in the common wiring portion for driving a large number of LEDs 210A. Accordingly, it is necessary to increase a diameter of the common wiring portion to prevent a variance in a light emitting state of the LEDs 210A due to a voltage variance caused by a wiring resistance of the common wiring portion.

When the LEDs 210A are driven in the time division way, it is necessary to divide the LEDs 210A into a plurality of groups, and to drive each group. Accordingly, when the LEDs 210A are divided into an N number of groups, it is necessary to provide an N number of common wiring portions in an entire configuration of the conventional LED print head. As a result, in a print circuit board constituting the conventional LED print head, an occupied area of the common wiring portions increases, thereby making it difficult to reduce a size of the conventional LED print head.

To this end, in the embodiment, instead of the LED having two terminals, the light emitting thyristors 210 with the three terminals are used as the light emitting elements. The common buffers 106 (106-1 and 106-2) are disposed in the driver IC 100, and the common gate wiring portion G is connected to the buffers 106. Further, the common gate wiring portion G is connected to the gates of the light emitting thyristors 210 through the individual circuits 140, so that the gates of the light emitting thyristors 210 are driven.

In other words, instead of the LED having two terminals, the light emitting thyristors 210 are used as the light emitting elements, and the gate drive circuits (for example, the buffers 160) for driving the gates of the light emitting thyristors 210 are consolidated in one location. Accordingly, it is possible to drive the gates through the individual circuits 140 with the level shift function of the NMOSs 140a per the gates of the light emitting elements 210. As a result, it is possible to minimize interference between the light emitting elements 210 driven concurrently, thereby driving the light emitting elements 210 under an ideal condition.

In the embodiment, when the gates of the light emitting thyristors 210 are driven in the turn-on process, a part of a rising portion of the anode current for the light emitting thyristors 210 is used. After the light emitting thyristors 210 are turned on (that is, the anode current reaches a specific level), a current does not flow through the individual circuits 140, so that the individual circuits 140 are substantially disconnected. Accordingly, even though the light emitting thyristors 210 have the three terminals, it is possible to substantially operate the light emitting thyristors 210 in the same manner as the LEDs with the two terminals, thereby operating the light emitting thyristors 210 in the configuration compatible with the conventional LED print head.

In the embodiment, the cathodes of the light emitting thyristors 210 are connected to the ground GND. Accordingly, it is possible to eliminate the power MOS transistor necessary for the conventional LED print head.

Further, in the conventional LED print head, when a large number of light emitting elements are divided into an N number of groups to be driven, the common wiring portion with a sufficiently large diameter is disposed per group. Accordingly, it is necessary to provide an N number of common wiring portions in an entire configuration of the conventional LED print head. On the other hand, in the embodiment, only one common ground wiring portion needs to be provided, thereby reducing an area of the print circuit board constituting the optical print head 13 or the number of wiring portions. Further, it is possible to reduce a space and cost of the optical print head 13 as compared with the conventional LED print head.

In the image forming apparatus 1 in the embodiment, the optical print head 13 is provided with the light emitting thyristors 210. Accordingly, it is possible to provide the image forming apparatus 1 with high quality of good space efficiency and light emitting efficiency. Further, in addition to the image forming apparatus 1 of full color, it is possible to obtain similar effects in image forming apparatus of multi color or monochrome using the optical print head 13 provided with the light emitting thyristors 210. Especially, in the image forming apparatus 1 of full color having a large number of the exposure devices, it is possible to obtain great effect.

Second Embodiment

A second embodiment of the present invention will be explained next. In the second embodiment, an individual circuit 150 has a configuration different from that of the individual circuit 140 in the first embodiment shown in FIGS. 9(a) to 9(d). Configurations of the optical print head 13 having the driver ICs 100 and the image forming apparatus 1 having the optical print head 13 are similar to those in the first embodiment.

Figure 15C:
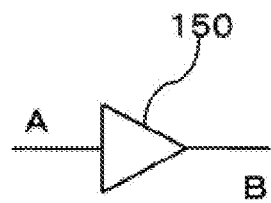
Figure 15C:
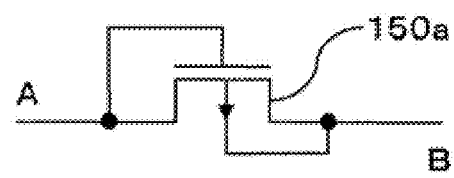
Figure 15C:
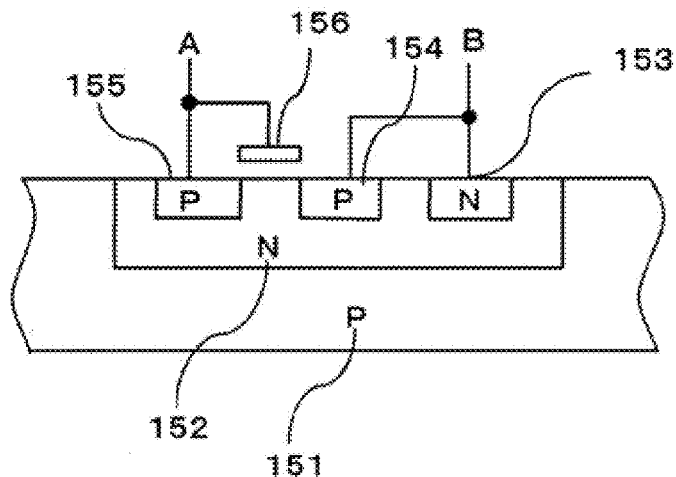
Figure 15D:
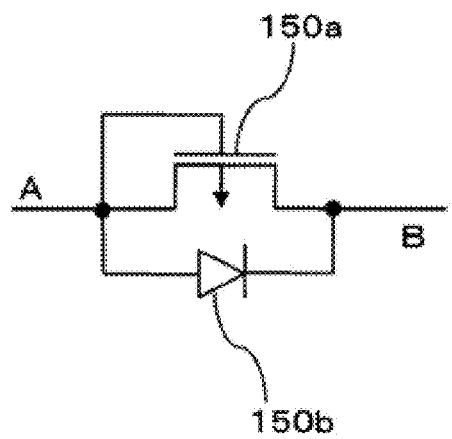

The configuration of the individual circuit 150 will be explained. FIGS. 15(a) to 15(d) are views showing the individual circuit 150 of the driver IC 100 for driving the gate according to the second embodiment of the present invention. More specifically, FIG. 15(a) is a model diagram of the individual circuit 150, FIG. 15(b) is a circuit diagram of the individual circuit 150, FIG. 15(c) is a schematic sectional view of an IC chip of the individual circuit 150, and FIG. 15(d) is an equivalent circuit diagram of the individual circuit 150.

As shown in FIGS. 15(a) and 15(b), the individual circuit 150 is formed of a PMOS 150a. A drain of the PMOS 150a is connected to the first terminal A, and source and source of the PMOS 150a are connected to the second terminal B. A substraight of the PMOS 150a is connected to the source thereof.

FIG. 15(c) is a schematic sectional view of the IC chip of the individual circuit 150 taken along a channel direction thereof. The PMOS 150a is produced through the following process.

A chip substrate 151 contains a P-type impurity, and the driver IC 100 shown in FIG. 1 is formed on the chip substrate 151. An N-type impurity is introduced into a specific location of the chip substrate 151 to form an N-well region 152. In the N-well region 152, there are arranged a sub-straight contact region 153 formed through diffusion of an N-type impurity, and a source region 154 and a drain region 155 formed through diffusion of a P-type impurity.

Further, a gate 146 formed of a poly-silicon is disposed between the source region 144 and the drain region 145. The sub-straight contact region 143 and the N-type source region 144 are connected to the first terminal A. The drain region 145 and the gate 146 are connected to the second terminal B.

In FIG. 15(c), similar to FIG. 9(c), for simplifying the drawing, a gate oxide film, a contact hole, a passivation protective film, and the likes are omitted. A metal wiring portion connected to each of the impurity diffusion regions is represented with a solid line.

FIG. 15(d) is the equivalent circuit diagram of the individual circuit 150 formed of the PMOS 150a. As shown in FIG. 15(d), the individual circuit 150 includes the PMOS 150a shown in FIG. 15(b). An anode of a parasitic diode 150b is connected to the first terminal A on the drain side of the PMOS 150a. A cathode of the parasitic diode 150b is connected to the second terminal B on the source side of the PMOS 150a. The parasitic diode 150b is formed of an PN junction created in an interface between the N-well region 152 and the P-type drain region 155 shown in FIG. 15(c).

Figure 16:
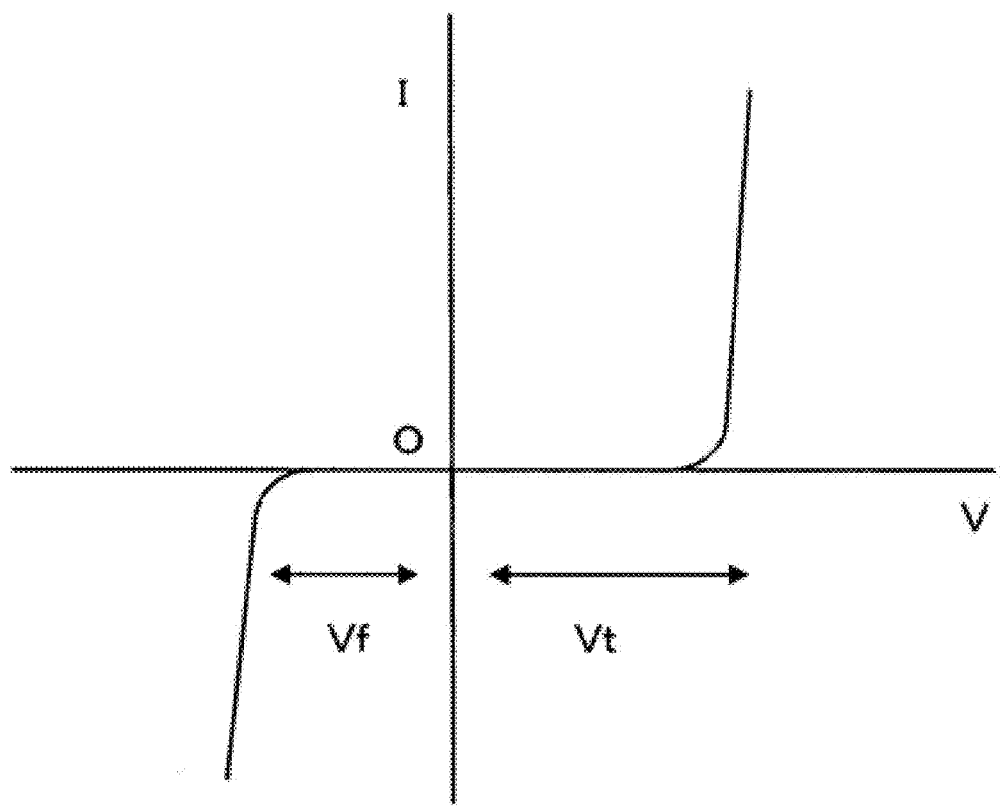
FIG. 16 is a graph showing a relationship between a voltage and a current of the individual circuit according to the second embodiment of the present invention.

An operation of the individual circuit 150 for driving the gate will be explained next. FIG. 16 corresponds to FIG. 11 in the first embodiment, and is a graph showing a relationship between a voltage and a current of the individual circuit 150 according to the second embodiment of the present invention. In FIG. 16, the vertical axis represents a voltage applied to the second terminal B with reference to the first terminal A, and a horizontal axis represents a current flowing between the second terminal B and the first terminal A.

In the individual circuit 150 shown in FIGS. 15(a) and 15(b), the PMOS 150a has the gate connected to the drain thereof. Accordingly, the voltage applied between the second terminal B and the first terminal A is equal to a voltage between the gate and the source of the PMOS 150a. When a potential of the second terminal B exceeds a threshold voltage Vt of the PMOS 150a over a potential of the first terminal A, a current flows from the second terminal B to the first terminal A.

Further, the second terminal B is connected to the sub-straight of the PMOS 150a and conducted with the N-type sub-straight contact region 153 in the N-well 152. The drain of the PMOS 150a is connected to the P-type drain region 155 in the N-well 152. Accordingly, in the equivalent circuit diagram shown in FIG. 15(d), the parasitic diode 150b is created between the first terminal A and the second terminal B. The first terminal A corresponds to the anode, and the second terminal B corresponds to the cathode.

When a potential of the first terminal A exceeds a forward voltage Vf of the parasitic diode 150b over a potential of the second terminal B, a current flows from the first terminal A to the second terminal B. As a result, the relationship between the voltage and the current shown in FIG. 16 is obtained. Accordingly, depending on the direction of the potential thus applied, a level shift circuit is constituted for shifting a voltage corresponding to the threshold voltage Vt of the PMOS 150a and the forward voltage Vf of the parasitic diode 150b in both directions.

As explained above, in the individual circuit 150 shown in FIGS. 15(a) to 15(d), depending on the output signal level of the buffer 160 for driving the individual circuit 150, when the voltage level of the first terminal A is the H level and substantially equal to the power source voltage VDD (for example, 5 V), the second terminal B outputs a voltage (for example, 4.4 V) smaller by the forward voltage Vf (for example, 0.6 V). Further, when the voltage level of the first terminal A is the L level and substantially equal to the ground potential (for example, 0 V), the second terminal B outputs a voltage (for example, 1 V) greater by the threshold voltage Vt (for example, 1 V). Accordingly, the individual circuit 150 is capable of transmitting the logic states, i.e., both the H level and the L level, of the buffer 160 for driving the individual circuit 150 to the gate of the light emitting thyristor 210.

Figure 17A:
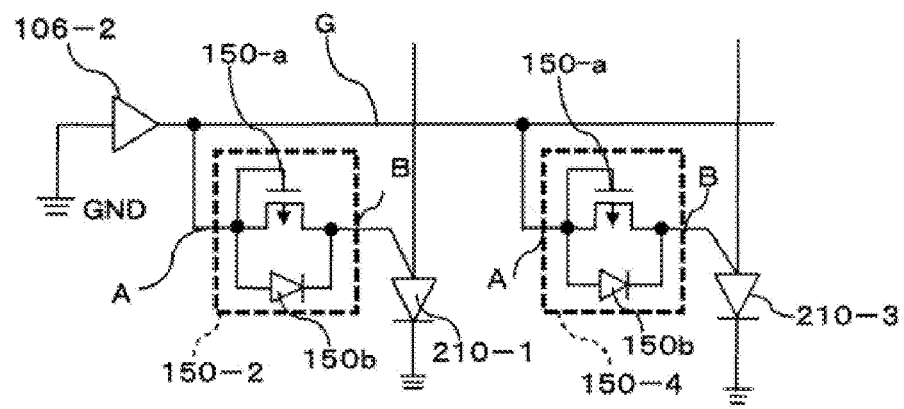
FIGS. 17(a) and 17(b) are circuit diagrams showing an operation of light emitting thyristors concurrently emitting light according to the second embodiment of the present invention.
Figure 17B:
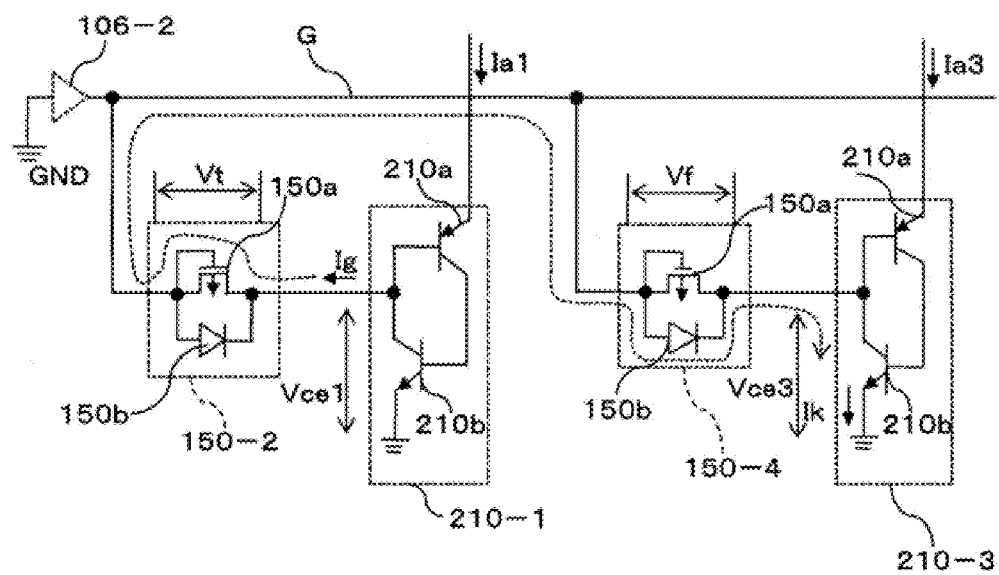

An operation of the light emitting thyristors 210 concurrently emitting light will be explained next. FIGS. 17(a) and 17(b) are circuit diagrams showing the operation of the light emitting thyristors 210 concurrently emitting light according to the second embodiment of the present invention. FIGS. 17(a) and 17(b) correspond to FIGS. 13(a) and 13(b) in the first embodiment, and show a connection state of the individual circuits 150 for driving the gates of the light emitting thyristors 210 shown in FIGS. 1 and 15. In FIGS. 17(a) and 17(b), similar to FIGS. 13(a) and 13(b), for an explanation purpose, only two individual circuits 150-2 and 15-4 (corresponding to the individual circuits 140-2 and 140-4 shown in FIGS. 13(a) and 13(b)) and two light emitting thyristors 210-1 and 210-3 are shown.

The common buffer 106-2 has the input voltage at the L level upon on control of the light emitting thyristors 210-1 and 210-3, so that the input voltage is represented as a state connected to the ground GND in FIGS. 17(a) and 17(b). The output side of the buffer 106-2 is connected to the common gate wiring portion G, and the common gate wiring portion G is connected to the first terminals A of the individual circuits 150-2 and 150-4. The second terminals B of the individual circuits 150-2 and 150-4 are connected to the gates of the light emitting thyristors 210-1 and 210-3, respectively.

As described above, the individual circuits 150-2 and 150-4 are formed of the PMOSs 150a and the parasitic diodes 150b. The light emitting thyristors 210-1 and 210-3 are formed of the PTRs 210a and the NTRs 210b. In FIG. 17(b), Vce1 represents the voltage between the collector and the emitter of the NTR 210b of the light emitting thyristor 210-1, and Vce3 represents the voltage between the collector and the emitter of the NTR 210b of the light emitting thyristor 210-3.

FIG. 17(b) shows a state that the light emitting thyristors 210-1 and 210-3 are concurrently turned on. As described above with reference to FIGS. 15(a) to 15(d) and 16, in the individual circuit 150-2, after the voltage level of the second terminal B becomes the L level for the turn-on instruction of the light emitting thyristor 210-1, and the light emitting thyristor 210-1 is turned on, it is possible to make the current flowing from the gate of the light emitting thyristor 210-1 to the second terminal B of the individual circuit 150-2 substantially zero. Accordingly, in FIG. 17(b), it is possible to ignore an influence of the buffer 160-2 connected to the common gate wiring portion G, so that the common gate wiring portion G is represented with a hidden line in FIG. 17(b).

When the light emitting thyristor 210-1 is turned on, and the drive current Ia1 flows in the anode thereof, the gate current Ig of the light emitting thyristor 210-1 flows an arrow path in FIG. 17(b).

When it is assumed that the gate current Ig flows, the gate current Ig flows between the emitter and the base of the PTR 210a of the light emitting thyristor 210-1. After the gate current Ig flows between the drain and the source of the NMOS 140a of the individual circuit 140-2 and a voltage decreases by the threshold voltage Vt, the gate current Ig flows through the parasitic diode 150b of the individual circuit 150-4 in the forward direction through the common gate wiring portion G, so that a voltage decreases by the forward voltage Vf. Afterward, the gate current Ig flows to the ground GND through the collector and the emitter of the NTR 210b of the light emitting thyristor 210-3.

Accordingly, the potential Vg between the gate of the light emitting thyristor 210-1 and the flow out side of the gate current Ig is given by $$Vg = Vt + Vf + Vce3$$

The voltage Vce1 between the collector and the emitter of the NTR 210b of the light emitting thyristor 210-1 is smaller than the calculated value of the gate voltage Vg. Accordingly, the base current Ib flowing through the base of the PTR 210b of the light emitting thyristor 210-1 does not flow the arrow path. Instead, the base current Ib merges the cathode current Ik of the PTR 210b as the collector current of the PTR 210b of the light emitting thyristor 210-1.

As shown in FIGS. 1 to 7, when the light emitting thyristors 210-1 and 210-3 emit light concurrently, since the gates thereof are connected to the individual circuits 150-2 and 150-4, respectively, and the gates of the light emitting thyristors 210-1 and 210-3 are not directly connected, a current component is not generated between the gates of the light emitting thyristors 210-1 and 210-3. As a result, the anode currents Ia1 and Ia3 supplied to the light emitting thyristors 210-1 and 210-3 flow between the anodes and the cathodes of the light emitting thyristors 210-1 and 210-3 as the cathode current Ik, so that the anode currents Ia1 and Ia3 are equal to the cathode current Ik. Accordingly, it is possible to adjust light power of the light emitting thyristors 210-1 and 210-3 only through the anode currents Ia1 and Ia3. That is, it is possible to arbitrarily adjust light power through adjusting the anode currents Ia1 and Ia3.

As described above, in the embodiment, similar to a conventional LED print head using LEDs, it is possible to adjust light power through the drive current. Further, it is possible to eliminate the power MOS transistor necessary in the conventional configuration, thereby reducing a size and cost of the optical print head 13.

In the second embodiment, instead of the LED having two terminals, the light emitting thyristors 210 are used as the light emitting elements, and the gate drive circuits (for example, the buffers 160) for driving the gates of the light emitting thyristors 210 are consolidated in one location. Accordingly, it is possible to drive the gates through the individual circuits 150 with the level shift function of the PMOSs 150a per the gates of the light emitting elements 210. As a result, it is possible to minimize interference between the light emitting elements 210 driven concurrently, thereby driving the light emitting elements 210 under an ideal condition and obtaining an effect similar to that in the first embodiment.

Note that the present invention is not limited to the first and second embodiments described above, and can be modified as follows.

In the first and second embodiments, the present invention is applied to the configuration in which the light emitting thyristors 210 are used as the light source. The present invention is also applicable to a configuration in which a thyristor is used as a switching element. In this case, it is possible to control a voltage applied to another element (for example, an organic luminescence element or an organic EL element) connected to the switching element in series. More specifically, the present invention is applicable to a printer having an organic EL print head formed of an organic EL element array, a thermal printer formed of a row of heat resistor members, a display device having a row of display elements, and the likes.

Further, the present invention is applicable to a thyristor used as a switching element of a display element (for example, display elements arranged in a row pattern or a matrix pattern). In addition to the thyristor with the three terminal structure, the present invention is applicable to a thyristor SCS (Silicon Semiconductor Controlled Switch) with four terminals including two gate terminals, i.e., a first gate terminal and a second gate terminal.

In the first and second embodiments, the light emitting thyristors 210 are the N-gate type formed of the PNPN structure, and may be a P-gate type or have a PNPNP structure.

The disclosure of Japanese Patent Application No. 2008-292020, filed on Nov. 14, 2008, is incorporated in the application by reference.

While the invention has been explained with reference to the specific embodiments of the invention, the explanation is illustrative and the invention is limited only by the appended claims.

What is claimed is:

1. A drive circuit for driving a plurality of light emitting thyristors each including an anode for receiving a drive signal to drive the light emitting thyristor, a cathode connected to ground, and a gate for receiving a control signal to drive the light emitting thyristor in a time division way, comprising:
    a plurality of drive elements for supplying the drive signal to the anodes of the light emitting thyristors;
    a plurality of common base lines for flowing the control signal to control on/off of the light emitting thyristors; and
    a plurality of individual circuits connected to the common base lines for supplying the control signal to the gates of the light emitting thyristors, said individual circuits having a function of shifting a level of the control signal,
    wherein each of said individual circuits is formed of an n-type conductive switch element having a first switch terminal connected to one of the common base lines, a second switch terminal connected to the gate, and a third switch terminal connected to the second switch terminal for controlling a conductive state between the first switch terminal and the second switch terminal.

2. The drive circuit according to claim 1, wherein each of said individual circuits is an N-channel MOS transistor having a source as the first switch terminal, a drain as the second switch terminal, and a gate as the third switch terminal.

3. An optical print head comprising,
    a light emitting thyristor array including a plurality of light emitting thyristors each including an anode for receiving a drive signal to drive the light emitting thyristor, a cathode connected to ground, and a gate for receiving a control signal to drive the light emitting thyristor in a time division way;
    a lens array for collecting light emitted from the light emitting element thyristor array; and
    the drive circuit according to claim 1.

4. An image forming apparatus comprising the optical print head according to claim 3 and a photosensitive member arranged to face the optical print head.

5. A drive circuit for driving a plurality of light emitting thyristors each including an anode for receiving a drive signal to drive the light emitting thyristor, a cathode connected to ground, and a gate for receiving a control signal to drive the light emitting thyristor in a time division way, comprising:
- a plurality of drive elements for supplying the drive signal to the anodes of the light emitting thyristors;
- a plurality of common base lines for flowing the control signal to control on/off of the light emitting thyristors; and
- a plurality of individual circuits connected to the common base lines for supplying the control signal to the gates of the light emitting thyristors, said individual circuits having a function of shifting a level of the control signal,
- wherein each of said individual circuits is formed of a p-type conductive switch element having a first switch terminal connected to the gate, a second switch terminal connected to one of the common base lines, and a third switch terminal connected to the second switch terminal for controlling a conductive state between the first switch terminal and the second switch terminal.

6. The drive circuit according to claim 5, wherein each of said individual circuits is an P-channel MOS transistor having a source as the first switch terminal, a drain as the second switch terminal, and a gate as the third switch terminal.

7. An optical print head comprising,
- a light emitting thyristor array including a plurality of light emitting thyristors each including an anode for receiving a drive signal to drive the light emitting thyristor, a cathode connected to ground, and a gate for receiving a control signal to drive the light emitting thyristor in a time division way;
- a lens array for collecting light emitted from the light emitting element thyristor array; and
- the drive circuit according to claim 5.

8. An image forming apparatus comprising the optical print head according to claim 7 and a photosensitive member arranged to face the optical print head.

* * * * *